US009134895B2

(12) United States Patent
Dove et al.

(10) Patent No.: US 9,134,895 B2
(45) Date of Patent: Sep. 15, 2015

(54) WIRING METHOD FOR A GRAPHICAL PROGRAMMING SYSTEM ON A TOUCH-BASED MOBILE DEVICE

(71) Applicant: NATIONAL INSTRUMENTS CORPORATION, Austin, TX (US)

(72) Inventors: Andrew P. Dove, Austin, TX (US); Jesse M. Attas, Austin, TX (US); Grant V. Macklem, Austin, TX (US); Jenica A. R. Welch, Austin, TX (US); Jeffrey L. Kodosky, Austin, TX (US); Christopher G. Cifra, Austin, TX (US); J. Adam Kemp, Austin, TX (US)

(73) Assignee: National Instruments Corporation, Austin, TX (US)

( * ) Notice: Subject to any disclaimer, the term of this patent is extended or adjusted under 35 U.S.C. 154(b) by 301 days.

(21) Appl. No.: 13/679,725

(22) Filed: Nov. 16, 2012

(65) Prior Publication Data

US 2013/0145312 A1 Jun. 6, 2013

Related U.S. Application Data

(60) Provisional application No. 61/561,646, filed on Nov. 18, 2011.

(51) Int. Cl.
| | |
|---|---|
| G06F 3/048 | (2013.01) |
| G06F 3/0488 | (2013.01) |
| G01R 1/02 | (2006.01) |
| H04Q 9/00 | (2006.01) |
| G01K 1/02 | (2006.01) |
| G06F 9/44 | (2006.01) |

(52) U.S. Cl.
CPC .............. *G06F 3/0488* (2013.01); *G01K 1/024* (2013.01); *G01R 1/025* (2013.01); *G06F 8/34* (2013.01); *H04Q 9/00* (2013.01); *H04Q 2209/50* (2013.01)

(58) Field of Classification Search
None
See application file for complete search history.

(56) References Cited

U.S. PATENT DOCUMENTS

| | | | |
|---|---|---|---|
| 7,493,570 B2 * | 2/2009 | Bobbin et al. ................. | 715/800 |
| 7,594,220 B2 | 9/2009 | Kodosky et al. | |
| 7,761,802 B2 | 7/2010 | Shah et al. | |
| 8,028,242 B2 | 9/2011 | Kodosky et al. | |
| 8,370,736 B2 | 2/2013 | Ording et al. | |
| 2003/0227483 A1 * | 12/2003 | Schultz et al. ................ | 345/763 |
| 2004/0088678 A1 * | 5/2004 | Litoiu et al. .................. | 717/104 |
| 2006/0168183 A1 * | 7/2006 | Fuller et al. ................... | 709/223 |
| 2008/0028338 A1 * | 1/2008 | Kodosky et al. .............. | 715/835 |
| 2009/0077478 A1 * | 3/2009 | Gillingham et al. .......... | 715/763 |
| 2010/0090964 A1 * | 4/2010 | Soo et al. ....................... | 345/173 |
| 2010/0235726 A1 * | 9/2010 | Ording et al. ................. | 715/234 |
| 2011/0225524 A1 | 9/2011 | Cifra | |
| 2013/0031501 A1 | 1/2013 | Kodosky et al. | |
| 2013/0031514 A1 | 1/2013 | Gabbert | |
| 2014/0189557 A1 * | 7/2014 | O'Connell et al. ........... | 715/767 |

* cited by examiner

*Primary Examiner* — Matt Kim
*Assistant Examiner* — Hua Lu
(74) *Attorney, Agent, or Firm* — Meyertons Hood Kivlin Kowert & Goetzel, P.C.; Jeffrey C. Hood; Mark S. Williams

(57) ABSTRACT

A touch-gesture wiring method for connecting data flow wires to input/output terminals of nodes in a graphical program is described. The method may be implemented by a graphical programming application that executes on a mobile device that includes a touch-sensitive screen configured to receive user input as touch gestures. The method may aid the user by displaying a magnified view of the input/output terminals that makes it easier (relative to the default view of the graphical program) for the user to see the input/output terminals and/or easier to select a desired one of the input/output terminals.

19 Claims, 60 Drawing Sheets

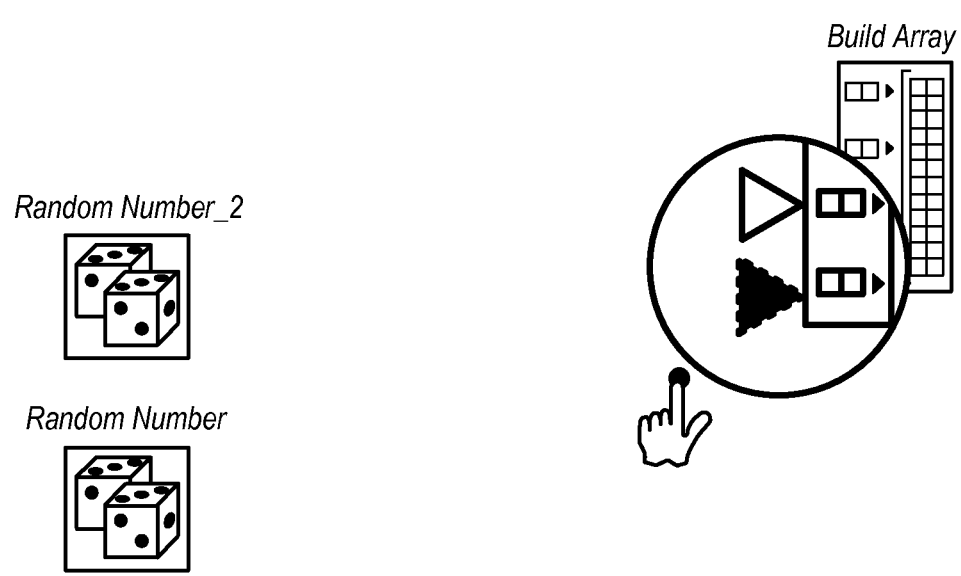
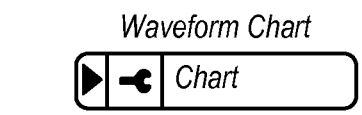
FIG. 10

Random Number_2
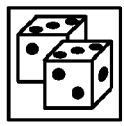
Random Number
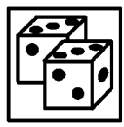
Build Array
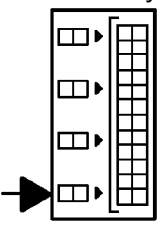
Waveform Chart
*FIG. 11*

Random Number_2
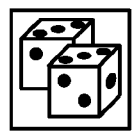
Random Number
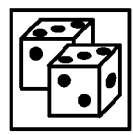
Build Array
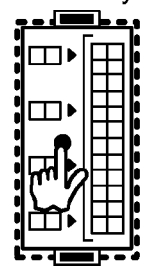
Waveform Chart
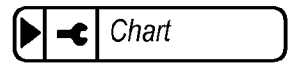
FIG. 18

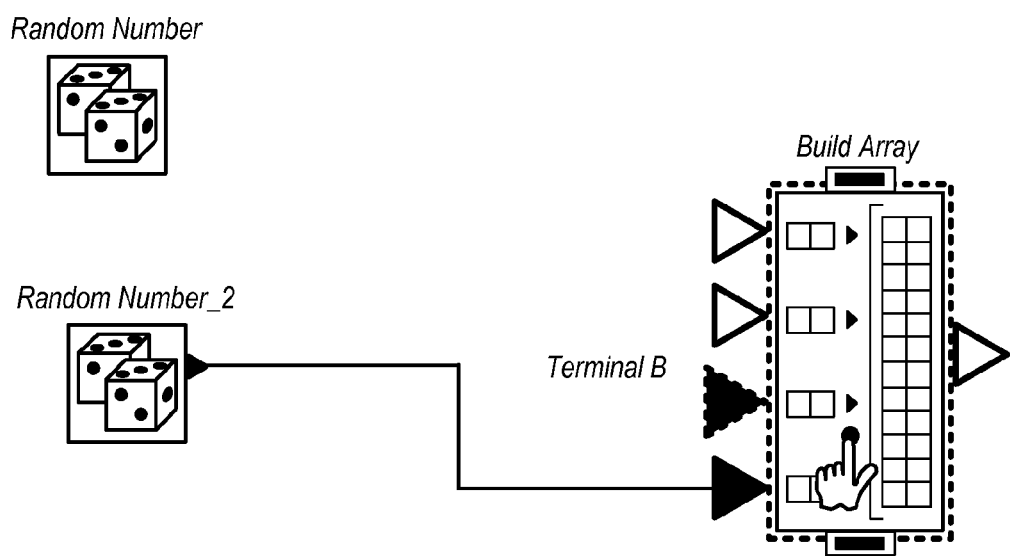
FIG. 25

Random Number
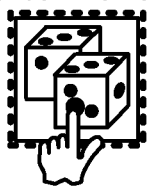
Random Number_2
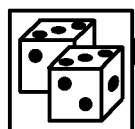
Build Array
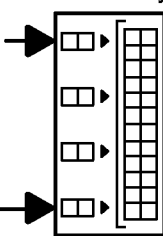
Waveform Chart
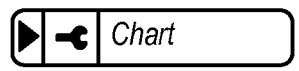
FIG. 28

Random Number_2
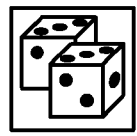
Random Number
Build Array
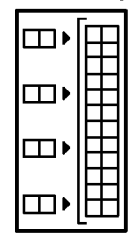
Waveform Chart
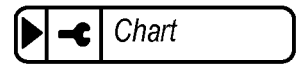
FIG. 35

Random Number_2
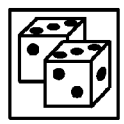
Random Number
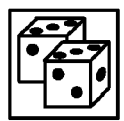
Build Array
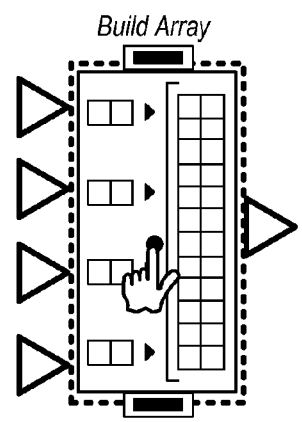
Waveform Chart
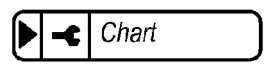
FIG. 36

Random Number_2
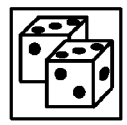
Random Number
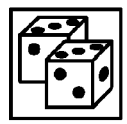
Build Array
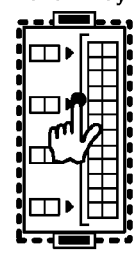
Waveform Chart
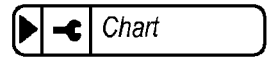
FIG. 41

TERMINAL SCROLLING
1. Node is not selected by default. A single tap selects the node
2. On single tap, a highlight and handles display. On second tap, terminals display.
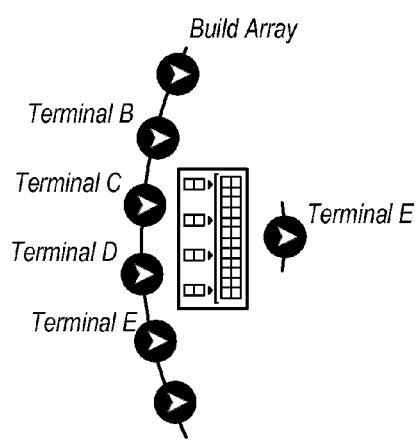
3. Terminals display. Scrolling is necessary to access some of the terminals.
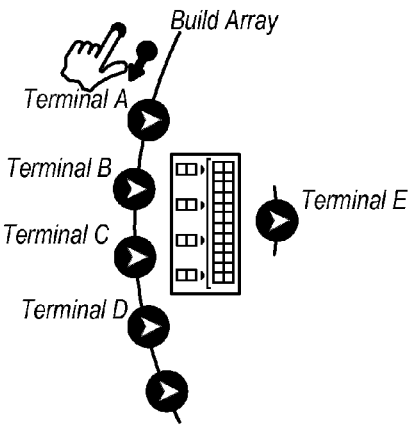
4. Drag and pull down to access terminals at the top of the queue.
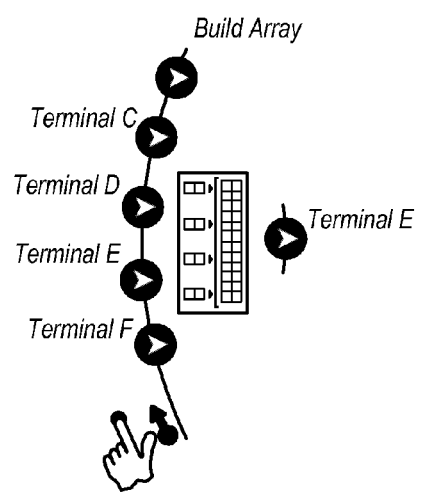
5. Drag and pull up to access terminals at the bottom of the queue.
FIG. 53

Random Number_2
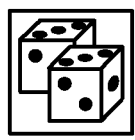
Random Number
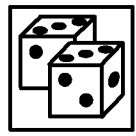
Build Array
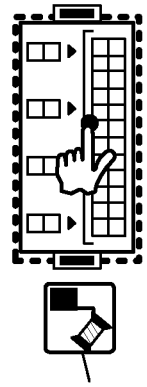
810
Wiring
Icon
Waveform Chart
*FIG. 54*

Random Number_2
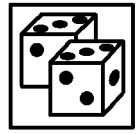
Build Array
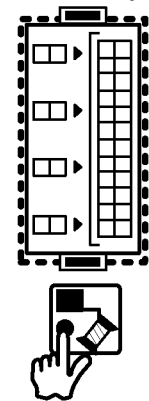
Random Number
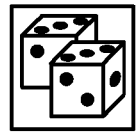
Waveform Chart
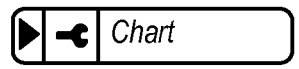
FIG. 55

WIRING METHOD FOR A GRAPHICAL PROGRAMMING SYSTEM ON A TOUCH-BASED MOBILE DEVICE

PRIORITY CLAIM

This application claims priority to U.S. provisional patent application No. 61/561,646 filed on Nov. 18, 2011, titled "Mobile Device with Graphical Programming and Measurement Data Viewing Features", whose inventor was Andrew P. Dove, which is hereby incorporated by reference.

FIELD OF THE INVENTION

The present invention relates to the fields of mobile computing devices and graphical programming, and more particularly to a system and method for wiring together nodes in a graphical program on a touch-based mobile device.

DESCRIPTION OF THE RELATED ART

Graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, modeling, simulation, image processing/machine vision applications, and motion control, among others.

SUMMARY

Various embodiments of a touch-gesture wiring method for aiding a user in connecting data flow wires to input/output terminals of nodes in a graphical program are described. Input terminals are terminals or points to which a data flow wire may be connected to provide data as input to a node, e.g., where the data is produced by another node to which the other end of the wire is connected. Output terminals are terminals or points to which a data flow wire may be connected to receive output data produced by a node, e.g., where the data is passed to another node to which the other end of the wire is connected.

The method may be implemented by a graphical programming application (e.g., a graphical program development environment) which executes on a device that includes a touch-sensitive screen configured to receive user input as touch gestures. For example, the device may be a mobile or handheld device, such as a tablet computer (e.g., an iPad™), smart phone, personal digital assistant (PDAs), etc. Mobile devices often have screens that are smaller than the display screens of desktop computer systems. The graphical programming application executed by the mobile device may include special features for aiding a user in wiring together graphical program nodes on a relatively small screen.

According to some embodiments of the wiring method, the graphical programming application may receive a touch gesture indicating that the user wants to connect one end of a wire to an input terminal of a first node. For example, the user may tap the first node, slide his finger near to the first node, or provide other touch gesture input selecting the first node to which he wants to connect the data flow wire. In response to detecting that the user wants to connect the data flow wire to the first node, the graphical programming application may display a magnified view of the input terminals of the first node. The displayed magnified view may be any graphical and/or textual information that makes it easier (relative to the default view of the first node) for the user to see the input terminals of the first node and/or easier to select a desired one of the input terminals. For example, the magnified view may show the first node at a larger size, may show the input terminals of the first node at a larger size, and/or may show additional icons or text corresponding to the input terminals, so as to enable the user to easily select the desired input terminal to which he wants to connect the data flow wire.

The graphical programming application may receive touch gesture input selecting a particular input terminal displayed in the magnified view, thus indicating to the graphical programming application that the user wants the wire to be connected to the selected input terminal of the first node.

The graphical programming application may also receive a touch gesture indicating that the user wants to connect the other end of the wire to an output terminal of a second node. In response, the graphical programming application may display a magnified view of the output terminals of the second node. The graphical programming application may receive touch gesture input selecting a particular output terminal displayed in the magnified view, thus indicating to the graphical programming application that the user wants the other end of the wire to be connected to the selected output terminal of the second node.

The result may be a wire displayed by the graphical programming application between the selected input terminal of the first node and the selected output terminal of the second node. The wire may be a data flow wire that visually indicates that the second node produces data which is passed as input to the first node.

BRIEF DESCRIPTION OF THE DRAWINGS

A better understanding of the invention can be obtained when the following detailed description is considered in conjunction with the following drawings, in which:

FIGS. 9-17 are screen shots illustrating a first embodiment of the touch-gesture wiring method for connecting together nodes in a graphical program;

FIGS. 18-34 are screen shots illustrating a second embodiment of the touch-gesture wiring method for connecting together nodes in a graphical program;

FIGS. 35-40 are screen shots illustrating a third embodiment of the touch-gesture wiring method for connecting together nodes in a graphical program;

FIGS. 41-53 are screen shots illustrating a fourth embodiment of the touch-gesture wiring method for connecting together nodes in a graphical program; and FIGS. 54-60 are screen shots illustrating a fifth embodiment of the touch-gesture wiring method for connecting together nodes in a graphical program.

Figure 1:
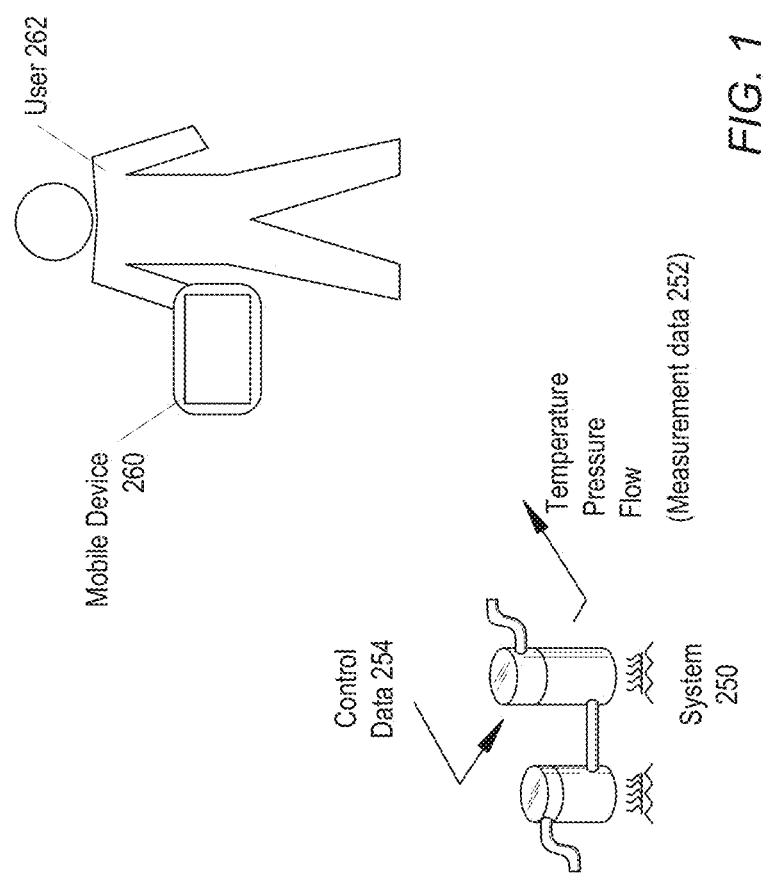
FIG. 1 is a diagram illustrating an application in which a graphical program executing on a mobile device communicates with a measurement system.

While the invention is susceptible to various modifications and alternative forms, specific embodiments thereof are shown by way of example in the drawings and are described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF VARIOUS EMBODIMENTS

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 7,210,117 titled "System and Method for Programmatically Generating a Graphical Program in Response to Program Information," filed Dec. 20, 2000.

TERMS

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DiaDem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Data flow programs can be contrasted with procedural programs, which specify an execution flow of computations to be performed. As used herein "data flow" or "data flow programs" refer to "dynamically-scheduled data flow" and/or "statically-defined data flow".

Graphical Data Flow Program (or Graphical Data Flow Diagram)—A Graphical Program which is also a Data Flow Program. A Graphical Data Flow Program comprises a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Various embodiments of a system and method for wiring together nodes in a graphical program on a touch-based mobile device are described. The mobile device may be configured to execute a graphical programming application. The graphical programming application may execute to display a graphical user interface for creating a graphical program. For example, the graphical programming application may enable the user to select a plurality of nodes and interconnect the nodes such that the plurality of interconnected nodes visually indicates functionality of the graphical program.

The graphical program may be configured to perform any of various kinds of applications. FIG. 1 illustrates one type of application in which a user 262 carries a mobile device 260 as the user walks through a factory floor or laboratory. The graphical program may execute on the mobile device 260 and may communicate with a measurement system 250. For example, the graphical program may produce control data 254 which is sent wirelessly by the mobile device 260 to the system 250. The system 250 may produce measurement data 252 (e.g., temperature, pressure, or flow data, or any of various other kinds of measurement data) which is sent back to the graphical program on the mobile device 260.

Figure 2:
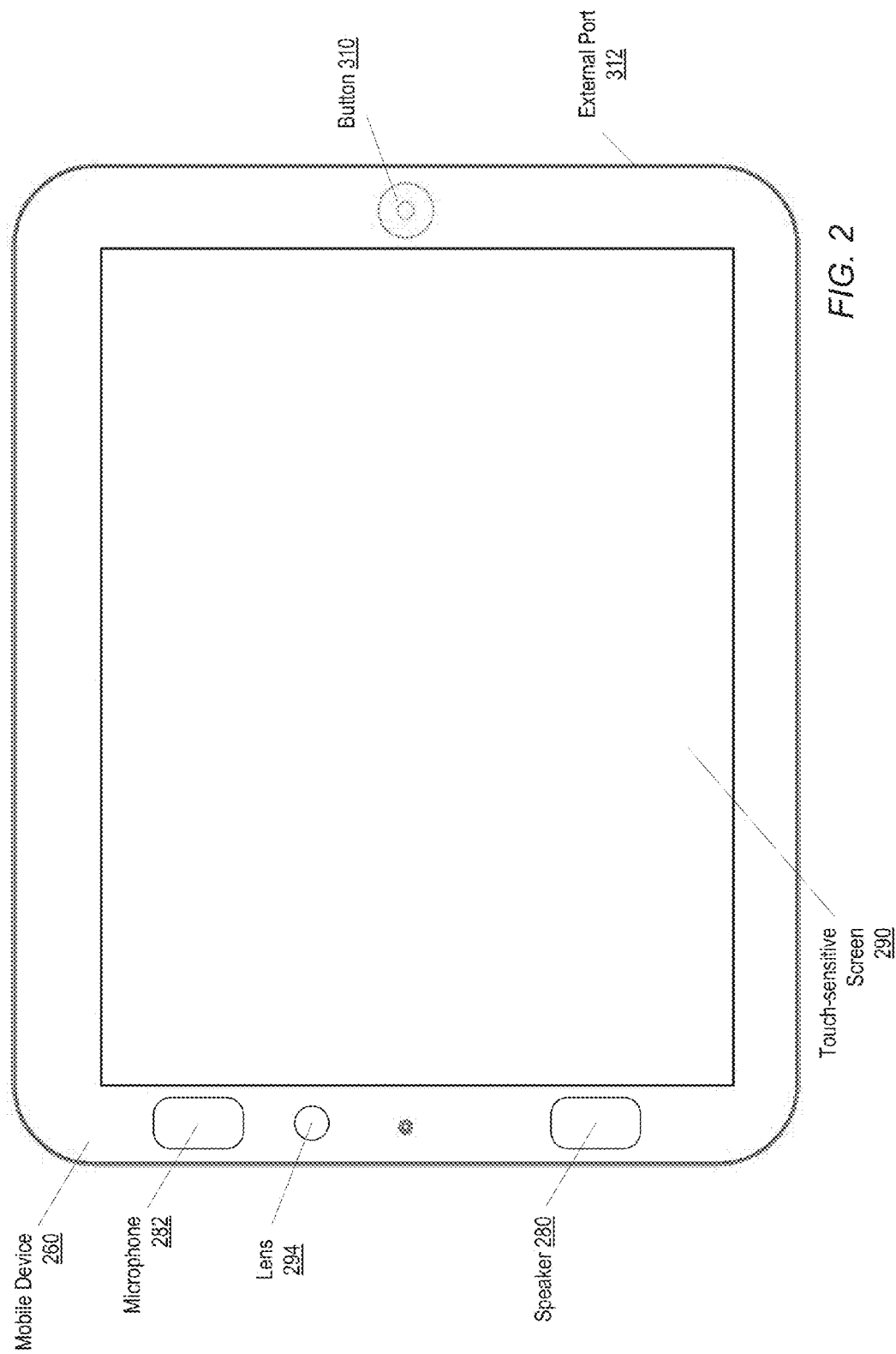
FIGS. 2 and 3 illustrate an example of the mobile device according to one embodiment.

In various embodiments the mobile device may be any kind of mobile or handheld device. Examples of mobile devices include tablet computers (e.g., an iPad™) smart phones, personal digital assistants (PDAs), etc. FIG. 2 illustrates one example of a mobile device 260. In this example, the mobile device includes a touch-sensitive screen 290 configured to receive user input as touch gestures. For example, the user may provide input to the mobile device by tapping the screen 290 with one or more fingers (or other touch devices) and/or sliding one or more fingers across the screen 290. The mobile device may also include other features such as a camera lens 294, microphone 282, speaker 280, one or more buttons 310, as well as one or more external ports 312 for connecting the mobile device to other devices via a cable.

Figure 3:
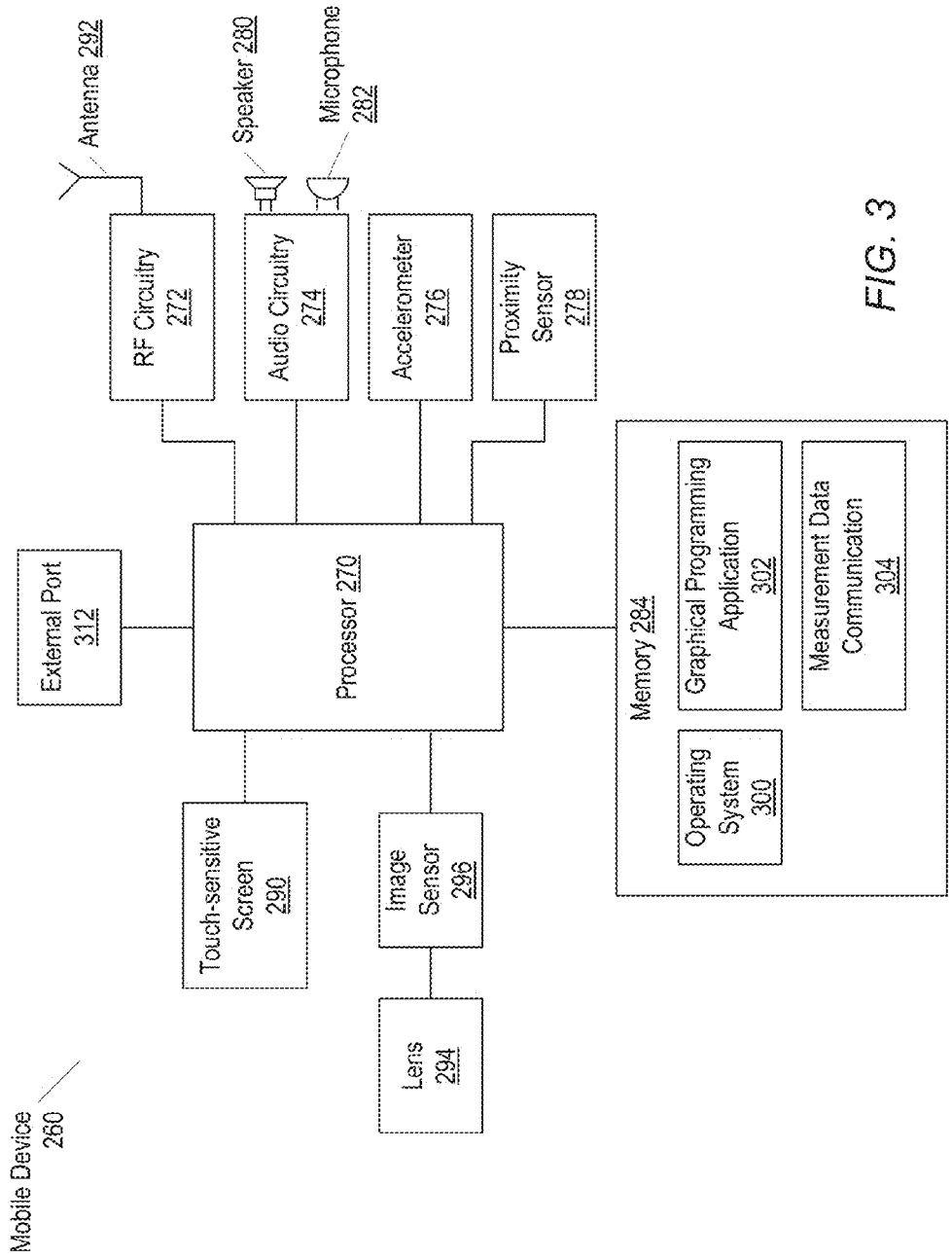

FIG. 3 illustrates an example of a mobile device 260 in more detail according to one embodiment. The mobile device may include one or more processors 270 configured to execute software stored in a memory 284. The memory 284 may store measurement data communication software 304 which is executable by the processor 270 to receive measurement data 252 from a system 250 and display the measurement data on the screen of the mobile device 260. The memory 284 may also store software which implements a graphical programming system 302. The graphical programming system software 302 may be executable by the processor 270 to create and store graphical programs in response to user input. The memory 284 may also store operating system software 300 or other software needed for operation of the mobile device.

In addition to a touch-sensitive screen 290, the mobile device may also include other hardware components, such as a lens 294 and image sensor 296 for a camera, one or more external ports 312 for connecting the mobile device to other devices via a cable, RF circuitry 272 and an antenna 292 for sending and receiving data wirelessly, audio circuitry 274 coupled to a speaker 280 and microphone 282, one or more accelerometers 276, and a proximity sensor 278.

Figure 4:
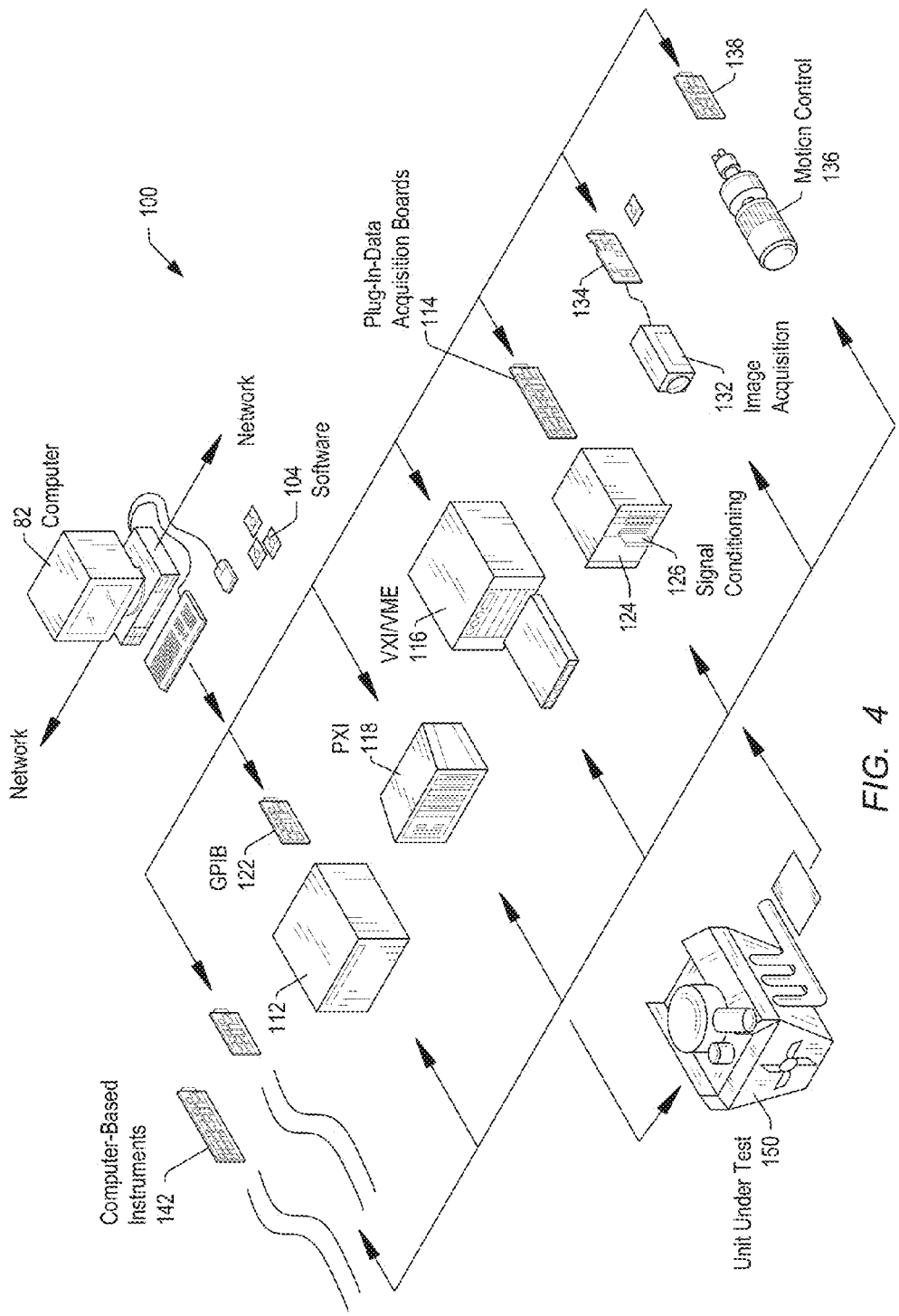
FIG. 4 illustrates an example of an instrumentation control system that includes various kinds of measurement devices which may produce measurement data transmitted to the graphical program on the mobile device.

In various embodiments the mobile device may execute the measurement data communication software 304 to receive and view measurement data produced by any kind of measurement devices associated with any kind of application. FIG. 4 illustrates an example of an instrumentation control system 100 which includes various kinds of measurement devices which may produce measurement data transmitted to the mobile device.

The system 100 includes a measurement computer system 82 which couples to one or more measurement devices or instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 5:
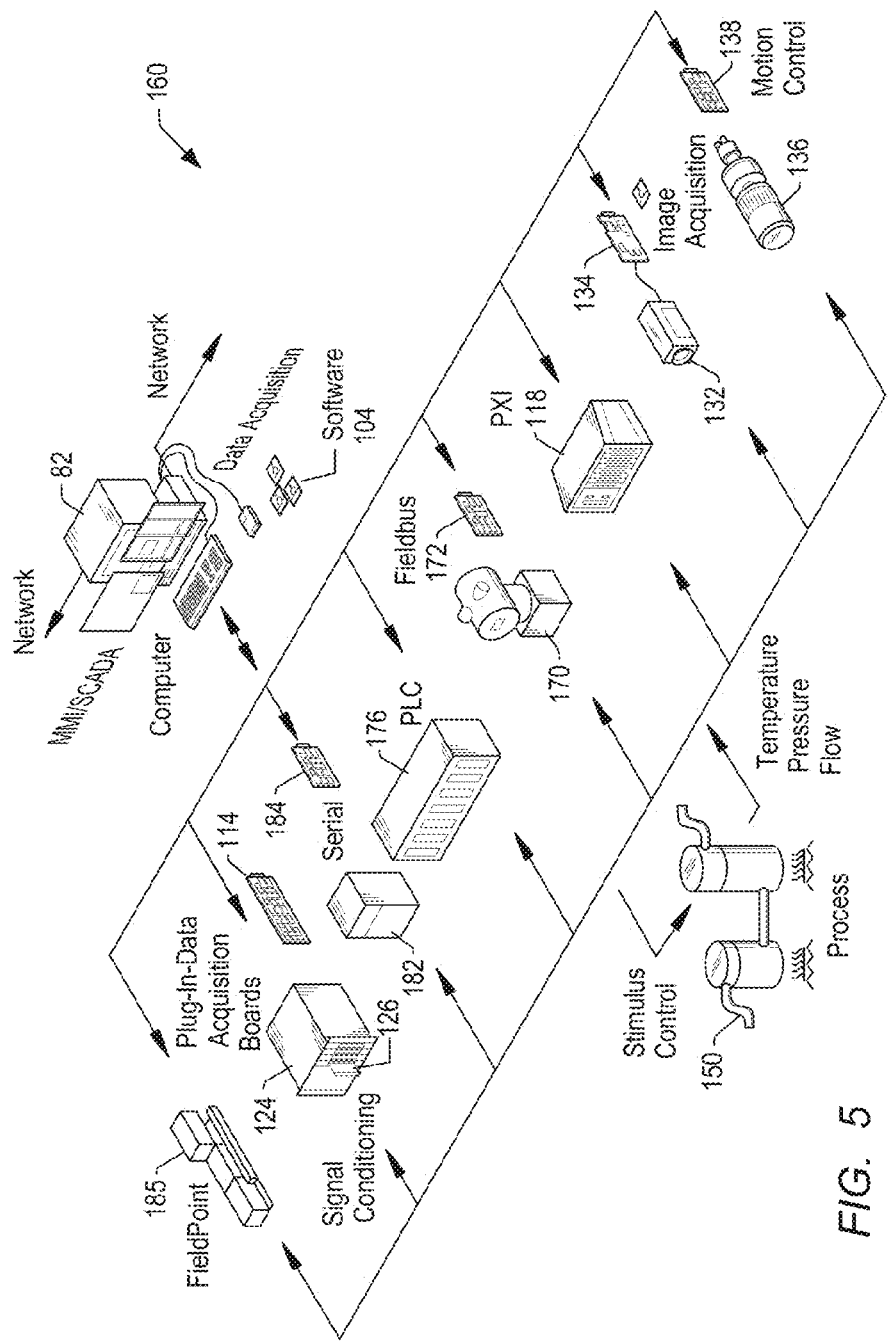
FIG. 5 illustrates an example of an industrial automation system that includes various kinds of measurement devices which may produce measurement data transmitted to the graphical program on the mobile device.

FIG. 5 illustrates an exemplary industrial automation system 160 which includes various kinds of measurement devices which may produce measurement data transmitted to the mobile device. The industrial automation system 160 is similar to the instrumentation or test and measurement system 100 shown in FIG. 4. Elements which are similar or identical to elements in FIG. 4 have the same reference numerals for convenience. The system 160 may comprise a measurement computer system 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as MMI (Man Machine Interface), SCADA (Supervisory Control and Data Acquisition), portable or distributed data acquisition, process control, advanced analysis, or other control, among others.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

Graphical software programs which perform data acquisition, analysis and/or presentation, e.g., for measurement, instrumentation control, industrial automation, modeling, or simulation, such as in the applications shown in FIGS. 4 and 5, may be referred to as virtual instruments.

In some embodiments the measurement data sources that are viewed by the measurement data communication software may be published by one or more graphical programs that execute on a computer system or on an embedded device in the measurement system. In addition to enabling a user to use a mobile device to view the measurement data produced by the graphical program, it may also be desirable to enable the user to use the mobile device to edit the graphical program. For example, if the user sees that the measurement system is not operating correctly then the user may want to make a change to the graphical program and then re-deploy the changed graphical program to the measurement system. The user may also want the ability to create entirely new graphical programs and execute them on the mobile device or deploy them to other devices for execution.

Figure 6:
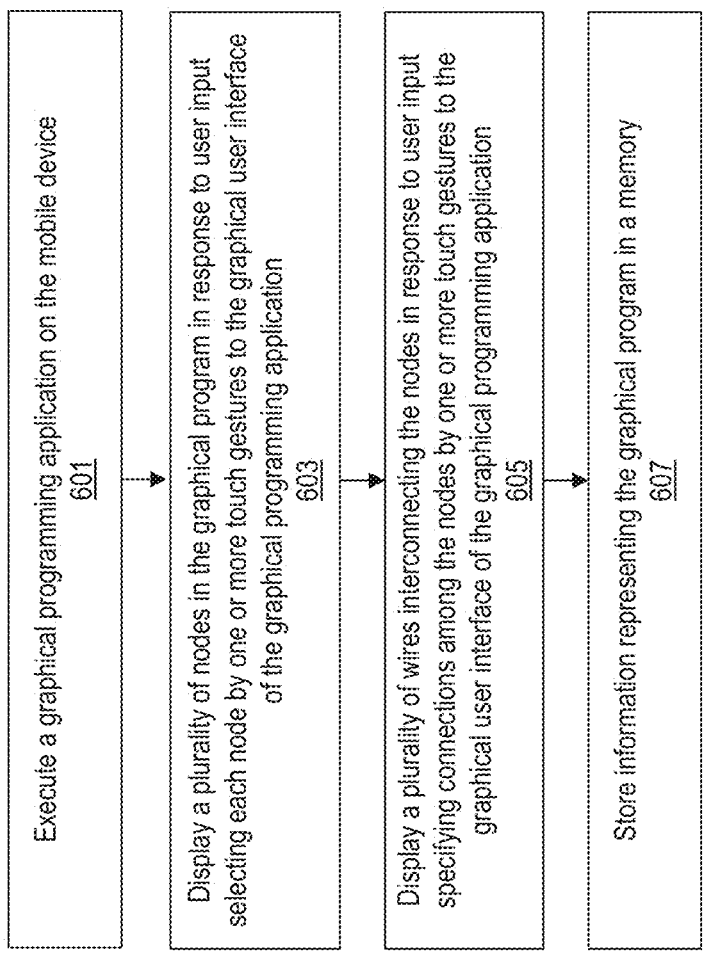
FIG. 6 is a flowchart diagram illustrating one embodiment of a method for creating a graphical program on a mobile device.

FIG. 6 is a flowchart diagram illustrating one embodiment of a method for creating a new graphical program on a mobile device. As indicated in block 601, a graphical programming application may be executed on the mobile device, e.g., the graphical programming application shown in FIG. 3.

The mobile device may include a touch-sensitive screen on which a graphical user interface of the graphical programming application can be displayed and via which the user can provide input in the form of touch gestures. As indicated in block 601, the graphical programming application may execute to display on the screen a plurality of nodes in the graphical program in response to user input selecting each node by one or more touch gestures to the graphical user interface of the graphical programming application.

As indicated in block 605, the graphical programming application may also display a plurality of wires interconnecting the nodes in response to user input specifying connections among the nodes by one or more touch gestures to the graphical user interface of the graphical programming application. The plurality of interconnected nodes may visually indicate the functionality that will be performed by the graphical program when it is executed. Various embodiments of a method for wiring the nodes together are described below.

As indicated in block 607, the graphical programming application may store information representing the graphical program in a memory. For example, the graphical program may be stored as one or more files.

Figure 7:
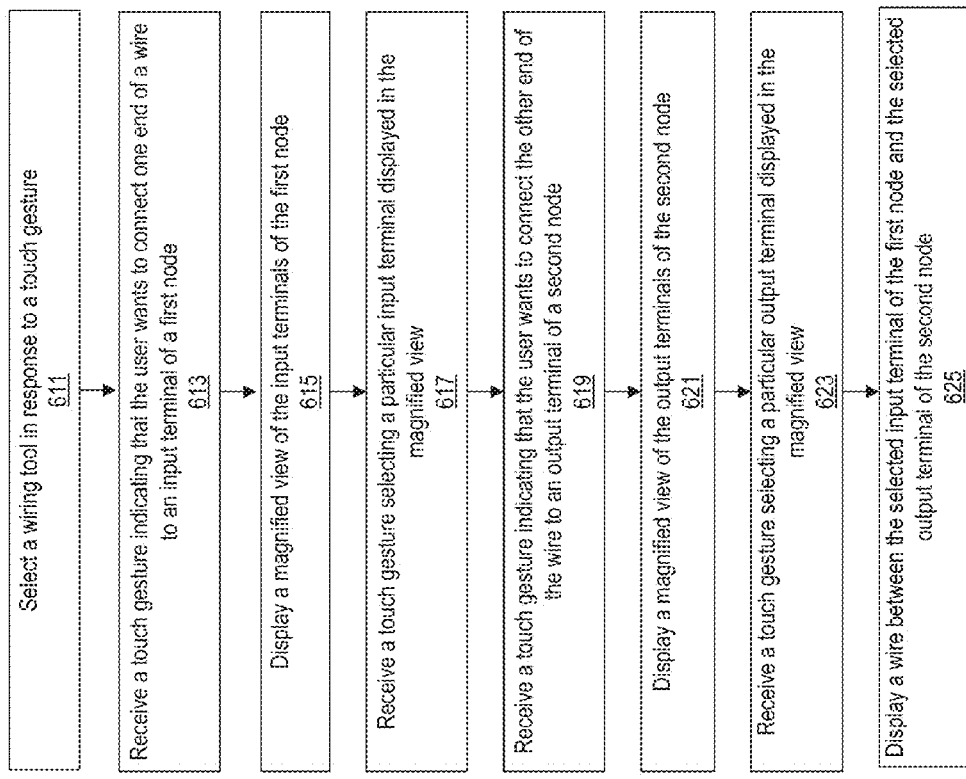
FIG. 7 is a flowchart diagram illustrating one embodiment of a touch-gesture wiring method for aiding a user in connecting data flow wires to input/output terminals of the nodes in the graphical program.

Mobile devices often have screens that are smaller than the display screens of desktop computer systems. The graphical programming application executed by the mobile device may include special features for aiding a user in creating or editing graphical programs on a relatively small screen. For example, FIG. 7 is a flowchart diagram illustrating one embodiment of a wiring method for aiding a user in connecting data flow wires to input/output terminals of the nodes in the graphical program. Input terminals are terminals to which a wire may be connected to provide data as input to a node, e.g., where the data is produced by another node to which the other end of the wire is connected. Output terminals are terminals to which a wire may be connected to receive output data produced by a node, e.g., where the data is passed to another node to which the other end of the wire is connected.

As indicated in block 611, in some embodiments the graphical programming application may select a wiring tool in response to a touch gesture. For example, the user may tap a button on the graphical user interface of the graphical programming application or provide other touch input indicating that the user wants to use the wiring tool to wire together the nodes in the graphical program.

As indicated in block 613, the graphical programming application may receive a touch gesture indicating that the user wants to connect one end of a wire to input terminal of a first node. For example, the user may tap the first node, slide his finger near to the first node, or provide other touch gesture input selecting the first node to which he wants to connect the data flow wire.

As indicated in block 615, the graphical programming application may display a magnified view of the input terminals of the first node in response to detecting that the user wants to connect the data flow wire to the first node. The displayed magnified view may be any graphical and/or textual information that makes it easier (relative to the default view of the first node) for the user to see the input terminals of the first node and/or easier to select a desired one of the input terminals. For example, the magnified view may show the first node at a larger size, may show the input terminals of the first node at a larger size, and/or may show additional icons or text corresponding to the input terminals, so as to enable the user to easily select the desired input terminal to which he wants to connect the data flow wire.

As indicated in block 617, the graphical programming application may receive touch gesture input selecting a particular input terminal displayed in the magnified view, thus indicating to the graphical programming application that the user wants the wire to be connected to the selected input terminal of the first node.

As indicated in block 619, the graphical programming application may also receive a touch gesture indicating that the user wants to connect the other end of the wire to an output terminal of a second node.

In response, the graphical programming application may display a magnified view of the output terminals of the second node, as indicated in 621.

As indicated in block 623, the graphical programming application may receive touch gesture input selecting a particular output terminal displayed in the magnified view, thus indicating to the graphical programming application that the user wants the other end of the wire to be connected to the selected output terminal of the second node.

The result may be a wire displayed between the selected input terminal of the first node and the selected output terminal of the second node, as indicated in 625. The wire may be a data flow wire that visually indicates that the second node produces data which is passed as input to the first node.

The user may wire select the input and output terminals to which to connect the wire in any order. For example, the user may be able to either select the input terminal of the first node and then select the output terminal of the second node, or vice versa. Various embodiments of the method of FIG. 7 are described in detail below.

Figure 8:
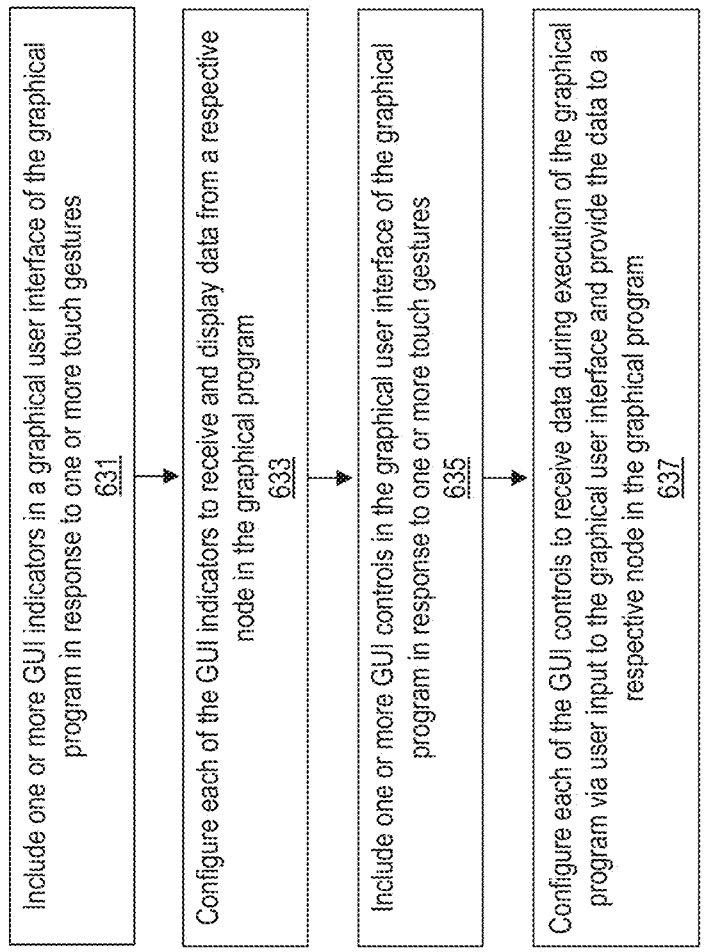
FIG. 8 is a flowchart diagram illustrating one embodiment of a touch-gesture method for creating a user interface for a graphical program.

The graphical programming application executing on the mobile device may also enable the user to create a graphical user interface for the graphical program. FIG. 8 is a flowchart diagram illustrating one embodiment of a method for creating the user interface.

As indicated in block 631, the graphical programming application may include one or more GUI indicators in the graphical user interface of the graphical program in response to one or more touch gestures. For example, the user may select each of the GUI indicators he wants to be displayed in the graphical user interface. As indicated in block 633, the graphical programming application may configure each of the GUI indicators to receive and display data from a respective node in the graphical program.

As indicated in block 635, the graphical programming application may also include one or more GUI controls in the graphical user interface of the graphical program in response to one or more touch gestures. As indicated in block 633, the graphical programming application may configure each of the GUI controls to receive data during execution of the graphical program via user input to the graphical user interface and provide the data to a respective node in the graphical program.

Figure 9:
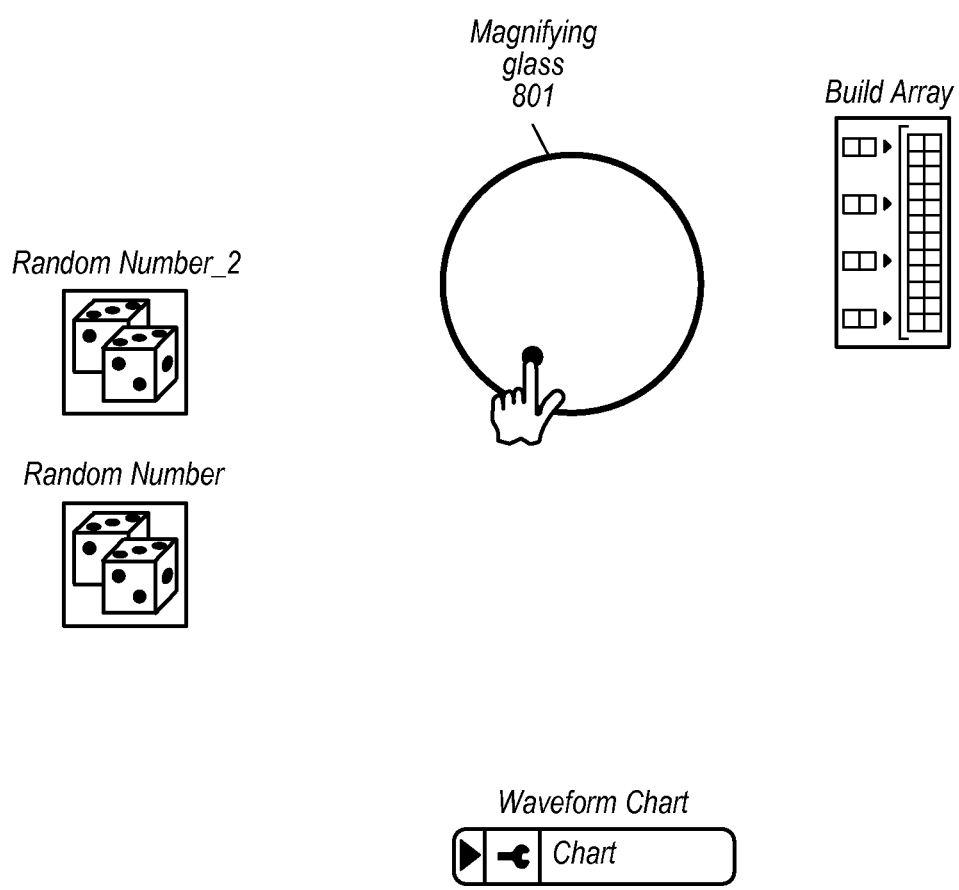
Figure 12:
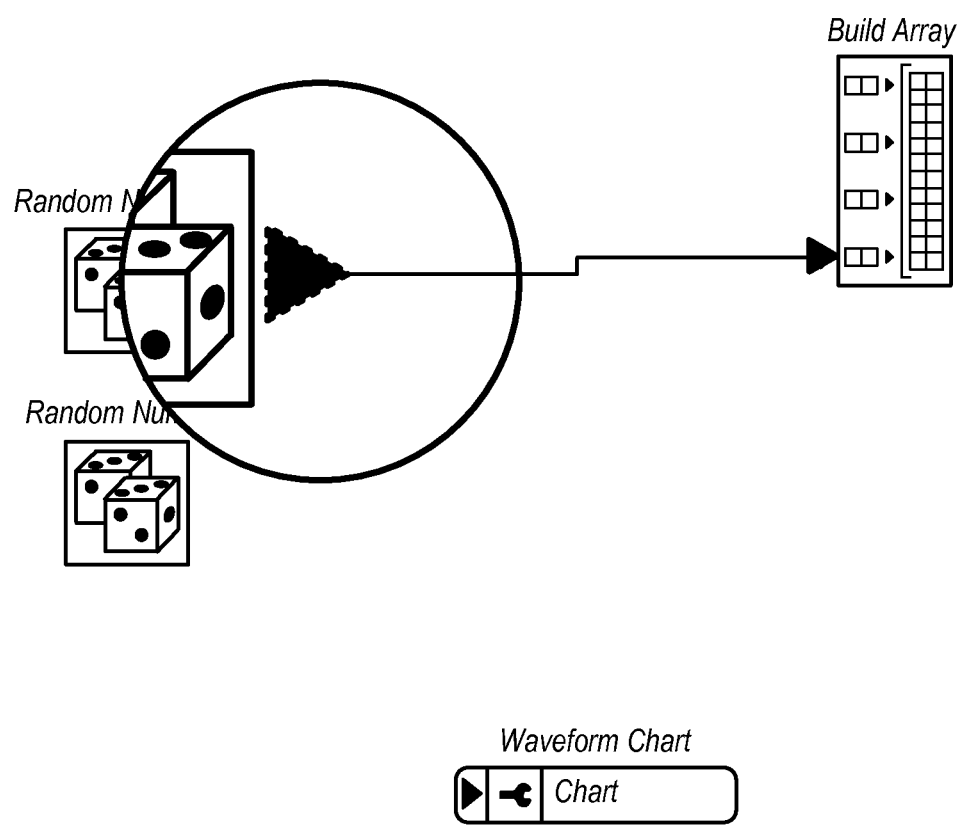

FIGS. 9-17 are screen shots illustrating a first embodiment of the wiring method for connecting together nodes in a graphical program. In this embodiment, a simulated magnifying glass is used to display the magnified view of the input/output terminals of the nodes. FIG. 9 illustrates the block diagram of a graphical program after the user has dropped several nodes into it. The user can tap a finger anywhere on the block diagram and hold it there for at least a threshold amount of time (e.g., 2 seconds, etc.) to cause the graphical programming application to display the magnifying glass 801 where the user's finger is. The user can then drag his finger around the block diagram, and the magnifying glass can follow the user's finger. The graphical programming application may display a magnified view of the nodes that fall within the magnifying glass. In various embodiments the magnifying glass may have any visual appearance that bounds a portion of the graphical program. In this example, the magnifying glass is shown as a black circle, but in other embodiments it may have other appearances, such as a rectangle for example. Also, in various embodiments the graphical programming application may be configured to display the magnifying glass in response to any of various kinds of touch-based user input.

In FIG. 10, the user has moved the magnifying glass over the lower half of the Build Array node, thus causing the two lower input terminals of this node to be displayed at a magnified size within the magnifying glass. More particularly, two terminal icons representing these two input terminals have been displayed within the magnifying glass. The user may then select one of these input terminals, e.g., by moving over the desired one. In this example, the user has selected the bottom terminal, as indicated by the filled-in shading.

As shown in FIG. 11, a wire arrow head is now connected to the input terminal selected by the user, thus indicating that a wiring operation has begun. The user now needs to connect the other end of the wire to an output terminal of another node.

In FIG. 12, the user has again tapped and held his finger to reveal the magnifying glass over the Random_Number_2 node (which has a single output terminal), and has then moved over the output terminal to select it. This connects the other end of the wire to the output terminal and causes the graphical programming application to display the wire between the selected input terminal of the Build Array node and the selected output terminal of the Random_Number_2 node.

Figure 13:
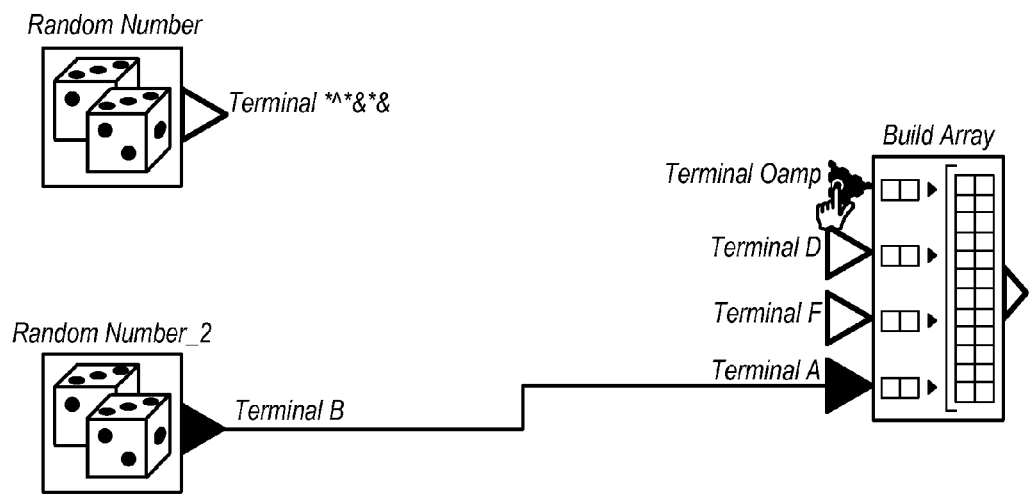

FIG. 13 illustrates the graphical program after the user has dragged the Random_Number node to a new position above the Random_Number_2 node, and has then used a zooming gesture (e.g., a two-finger spreading gesture) to cause the graphical programming application to display a zoomed-in view of the entire graphical program. In the zoomed-in view, all of the nodes are displayed at a larger size, and terminal icons representing the input/output terminals of the nodes are also displayed, whereas these terminal icons are absent in the normal view. In this example the terminal icons are displayed as triangles, but in other embodiments they may have any other appearance. A given node can have one or more input terminals and/or one or more output terminals. By convention, input terminals are displayed on the left of the node, and output terminals are displayed on the right. For example, in FIG. 13 the Random_Number and Random_Number_2 nodes both have a single output terminal, and the Build Array node has four input terminals.

Figure 14:
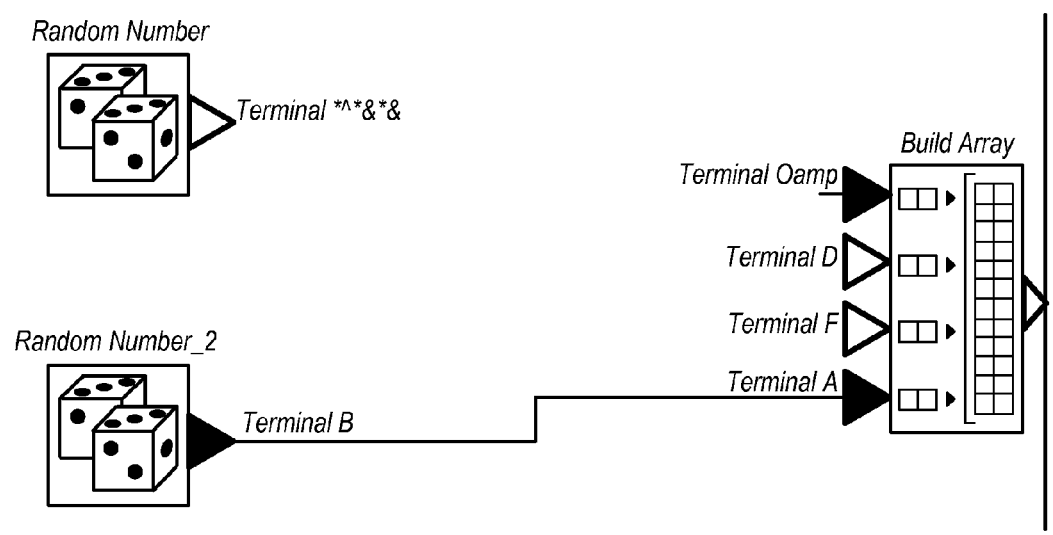

In the zoomed-in view, the user can tap on a terminal icon to indicate that the user wants to connect a wire to it. In FIG. 13 the user has tapped the top-most input terminal icon of the Build Array node to select it. FIG. 14 illustrates the graphical program after the tap. A wire arrow head is shown next to the selected input terminal icon, thus visually indicating that a wiring operation has begun.

Figure 15:
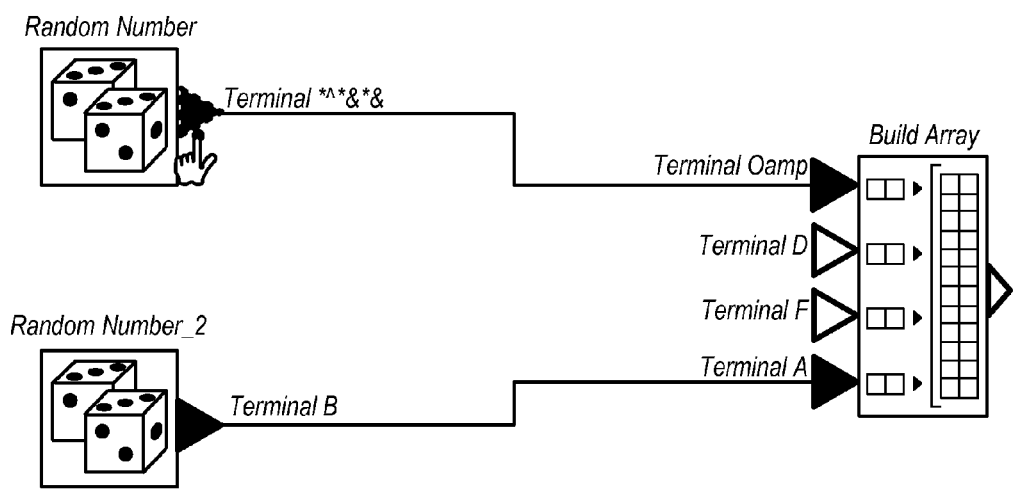

In FIG. 15 the user has completed the wiring operation by tapping on the output terminal of the Random_Number node. In response, the graphical programming application has displayed a wire connecting this output terminal to the selected input terminal of the Build Array node.

Figure 16:
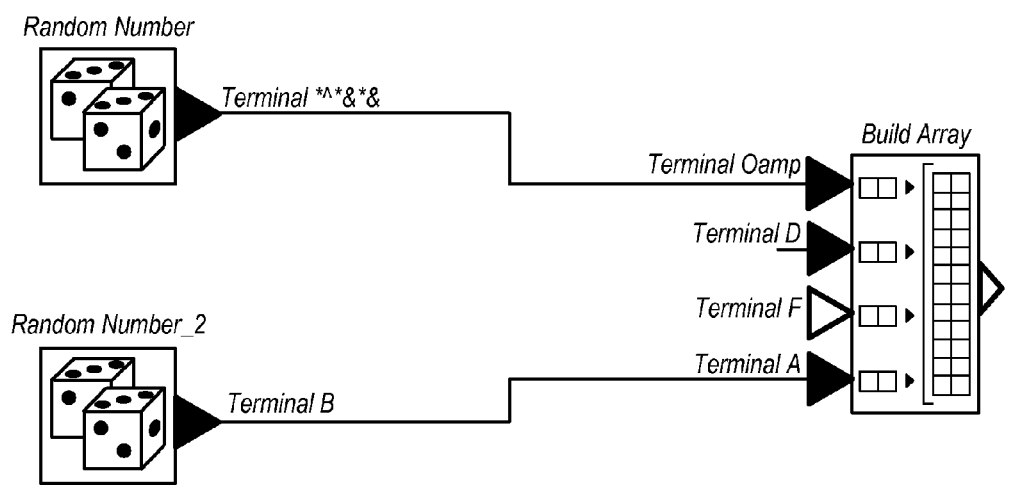
Figure 17:
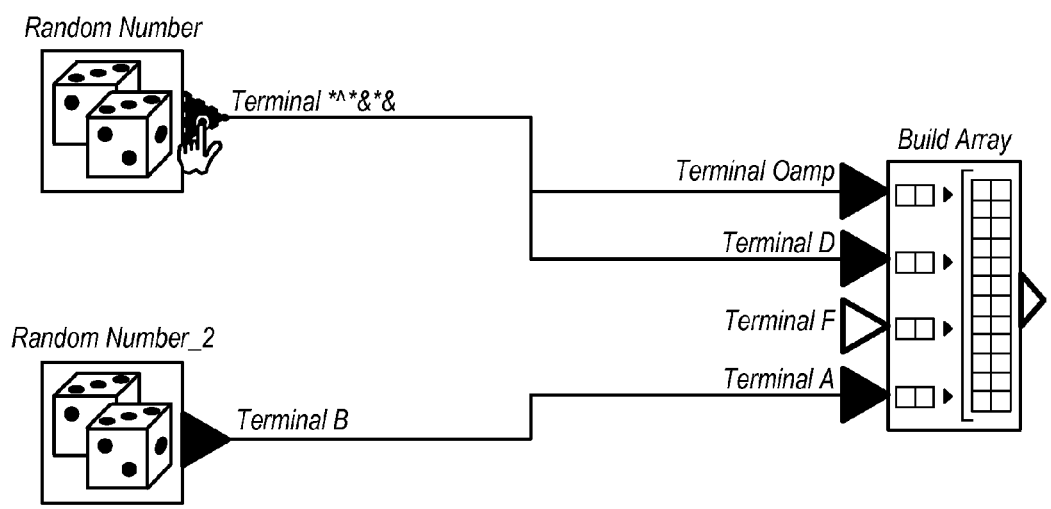

FIG. 16 illustrates the graphical program after the user has selected the Terminal D input terminal of the Build Array to begin another wiring operation. In FIG. 17 the user has completed the wiring operation by selecting the output terminal of the Random Number node. Since this same output terminal was already connected to another input terminal, a wire branch has automatically been displayed to indicate both of the input terminals to which the output terminal is connected.

Figure 19:
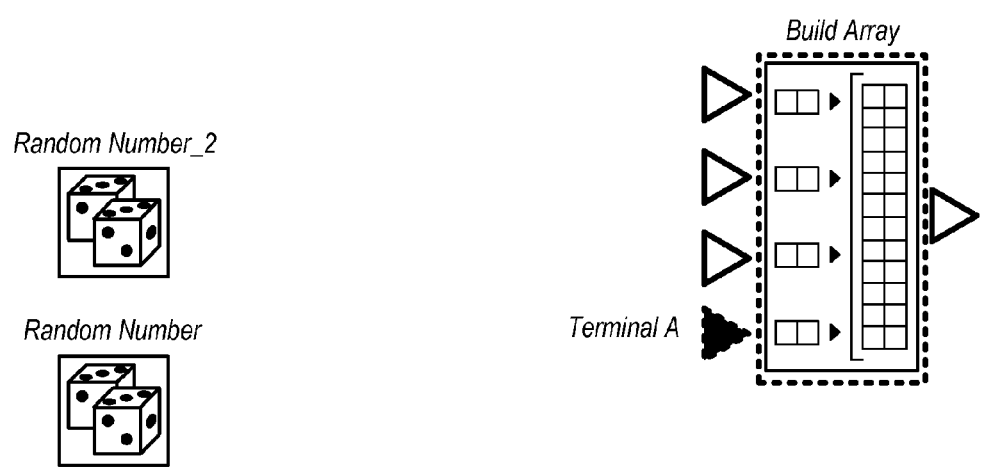

FIGS. 18-34 are screen shots illustrating a second embodiment of the wiring method for connecting together nodes in a graphical program. FIG. 18 illustrates the block diagram of a graphical program after the user has dropped several nodes into it. In FIG. 18 the user has tapped on the Build Array node with a finger to select this node. FIG. 19 shows the graphical program after the user has then tapped on the Build Array node a second time. This causes the graphical programming application to display a magnified view of the input and output terminals of the Build Array node by displaying triangular terminal icons representing the respective terminals. In this example, the bottom-most (Terminal A) input terminal of the Build Array is initially selected (as indicated by the filled-in shading) for wiring when the magnified view is displayed.

Figure 20:
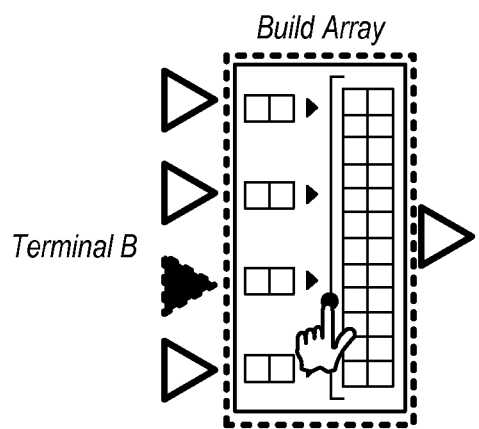
Figure 21:
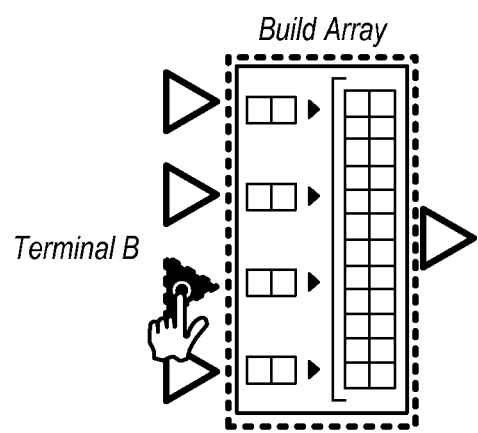

The user can change which terminal is selected in various ways. For example, as shown in FIG. 20 the user can tap the Build Array node again to cause the selection to move to the next (Terminal B) input terminal. Each time the user taps on the node, the selection may move to the next terminal, thus enabling the user to cycle through all the terminals of the node until the desired one is selected. Instead of tapping within the node, the user may directly tap on the desired terminal that he wants to select. For example, FIG. 21 shows the user tapping directly on the Terminal B input terminal to select it.

Figure 22:
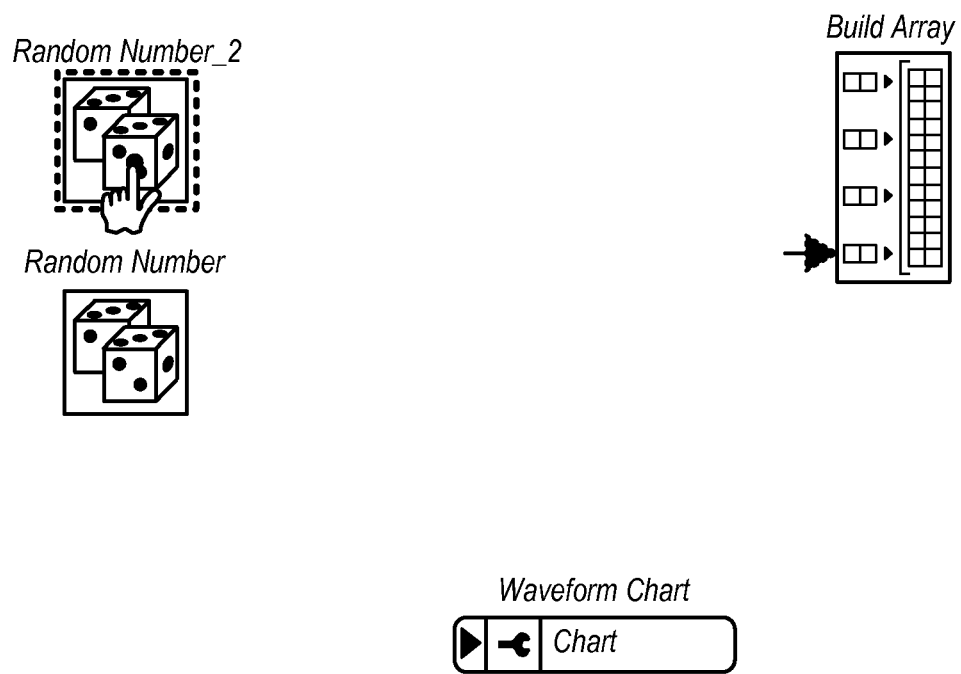
Figure 23:
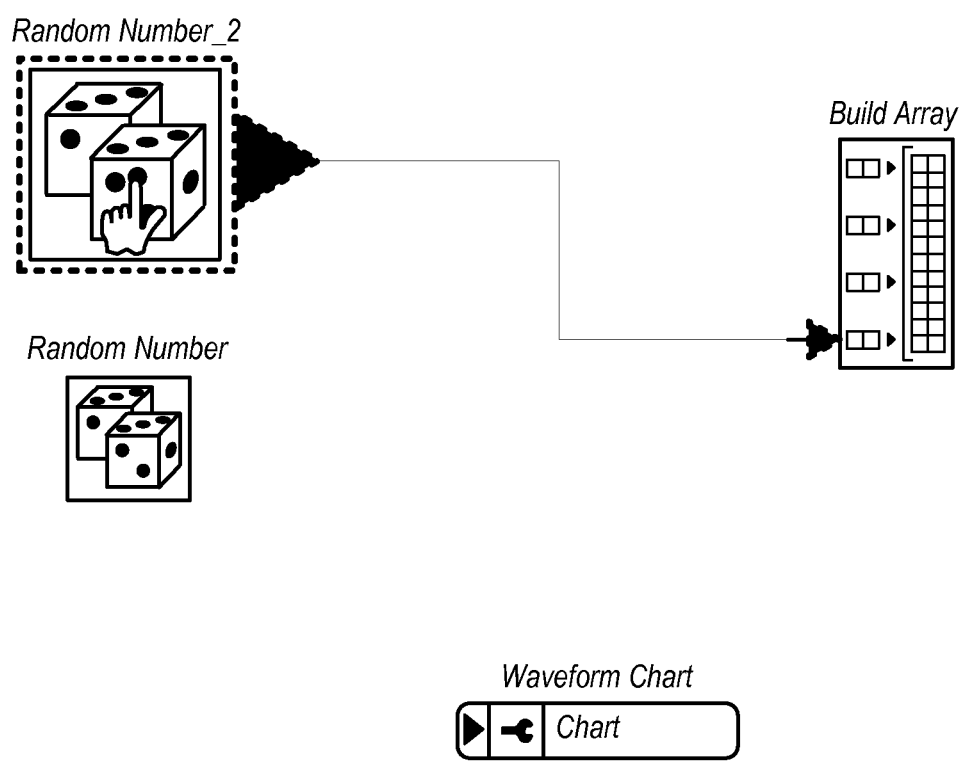

FIG. 22 shows the graphical program after the user has selected the Terminal A input terminal. The magnified view has been removed, and a wire arrow head is displayed next to the selected terminal to indicate that a wiring operation has begun. The user has also tapped once on the Random_Number_2 node to select it. In response, the graphical programming application has displayed a thick border around this node to indicate that it is now selected. In FIG. 23, the user has tapped a second time on the Random_Number_2 node, causing the graphical programming application to display a magnified view showing the output terminal of this node. In this case, since there is only one output terminal to which the wire can be connected to complete the wiring operation, the graphical programming application has automatically connected the other end of the wire to this output terminal to complete the wiring operation.

Figure 24:
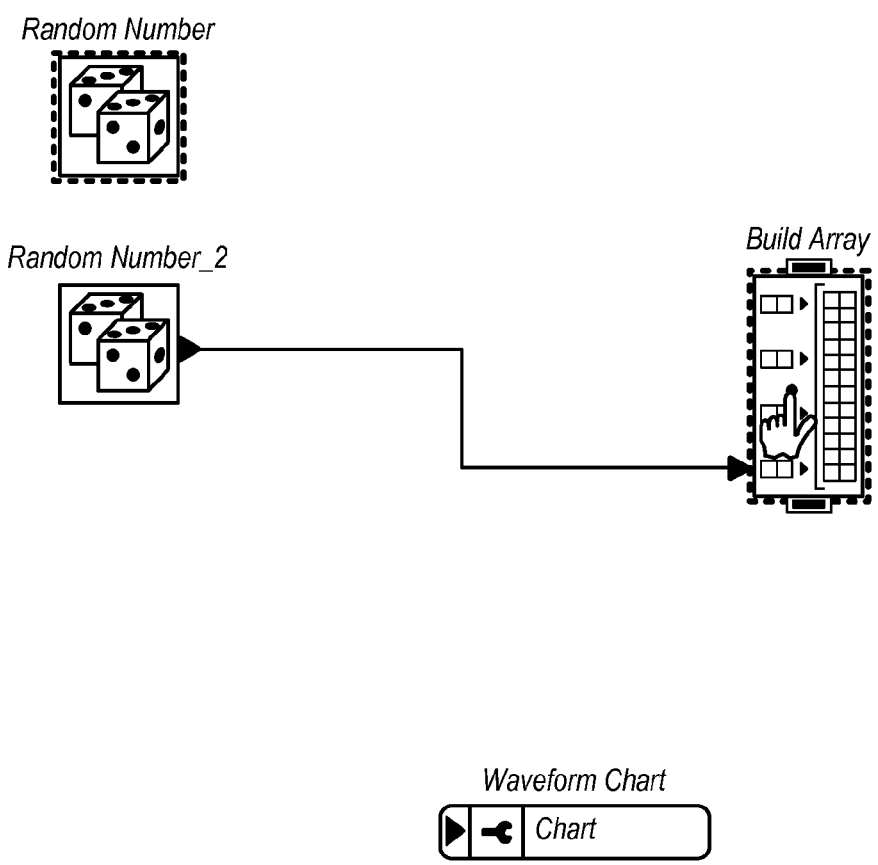
Figure 26:
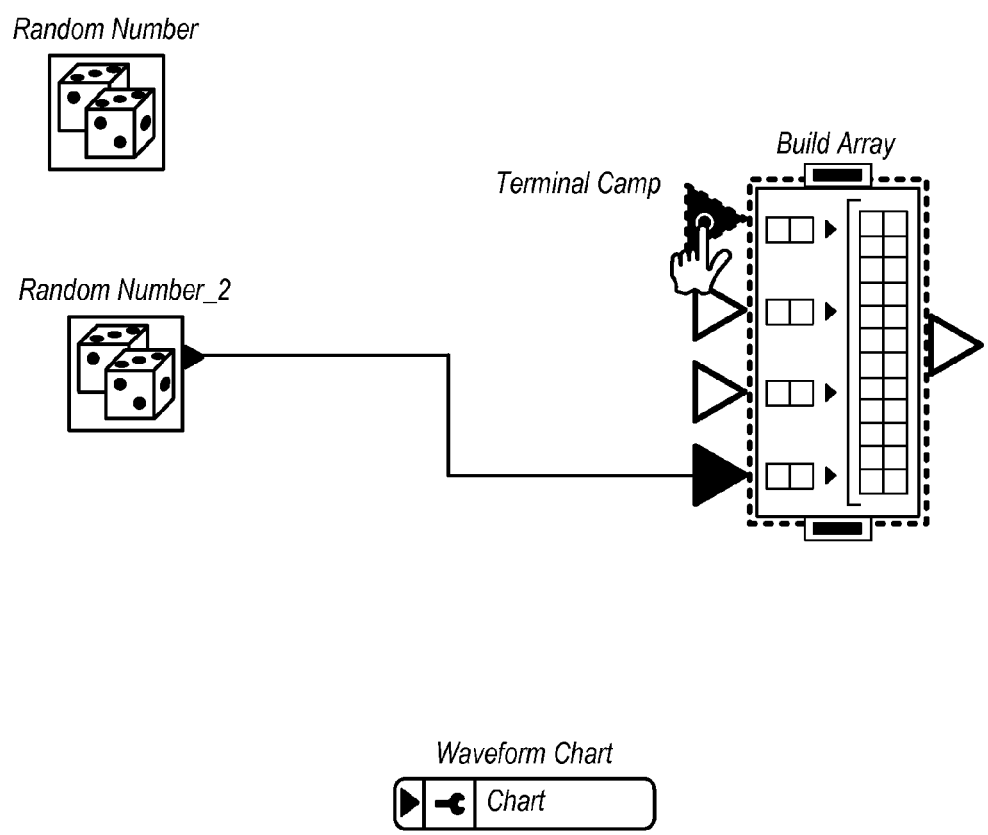
Figure 27:
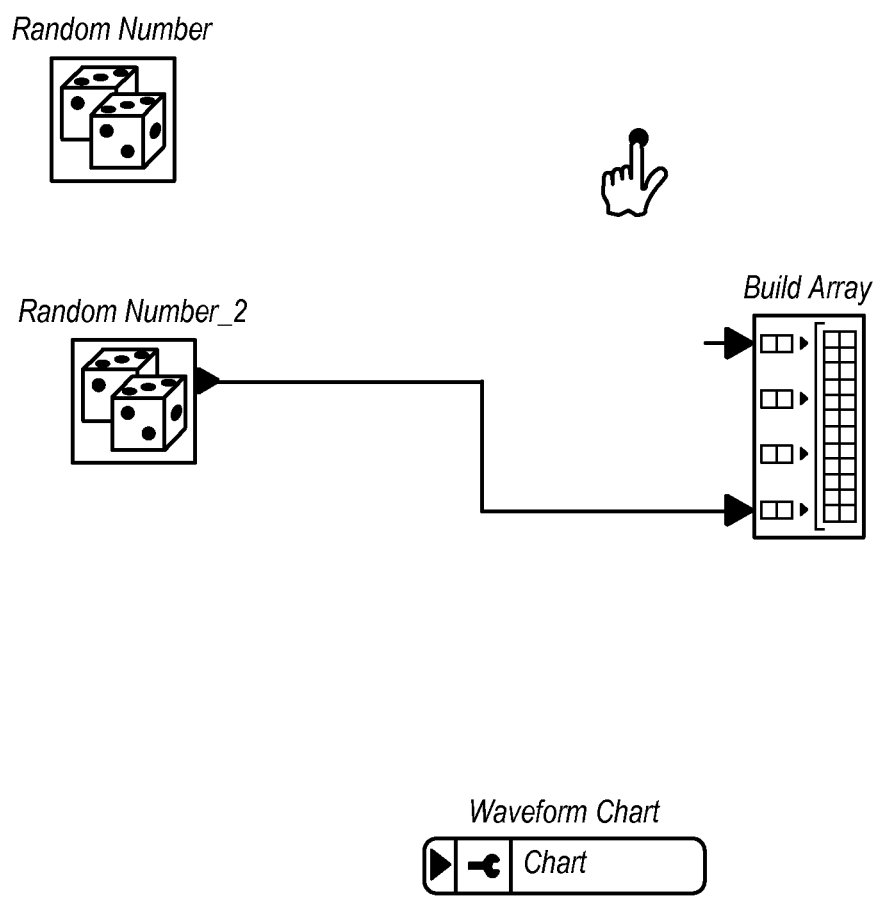

FIG. 24 illustrates the graphical program after the user has dragged the Random_Number node to a new position above the Random_Number_2 node, and has then tapped once on the Build Array node to select it. FIG. 25 illustrates the graphical program after the user has tapped on the Build Array node a second time to display the magnified view of its input/output terminals. Whereas the bottom-most (Terminal A) terminal was selected by default previously, this time the next (Terminal B) terminal is selected by default (as indicated by the filled-in shading) since the bottom-most terminal already has a wire connected to it. In FIG. 26 the user has changed the selected terminal to be the top-most (Terminal Camp) input terminal by tapping directly on it. The user may then tap another location in the graphical program (e.g., a blank spot where nothing is located) to cause the graphical programming application to remove the magnified view and display an arrow head next to the selected input terminal to indicate that a new wiring operation has begun, as shown in FIG. 27.

Figure 29:
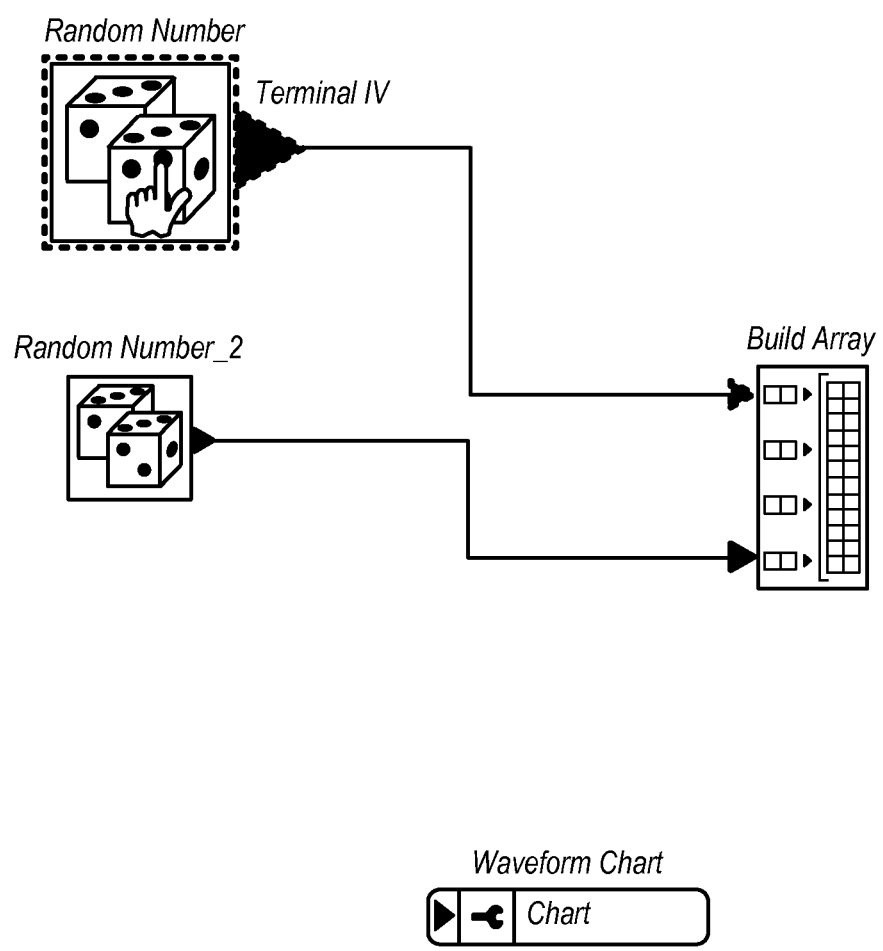

FIG. 28 shows the user tapping a finger once on the Random Number node to select it. The user may then tap the Random Number node a second time to cause the graphical programming application to automatically complete the wiring operation, as shown in FIG. 29. (Again, it can be automatically completed since there is only one output terminal in the node. If there were multiple available output terminals then the user may need to select which one to use, similarly as for the Build Array node.)

Figure 30:
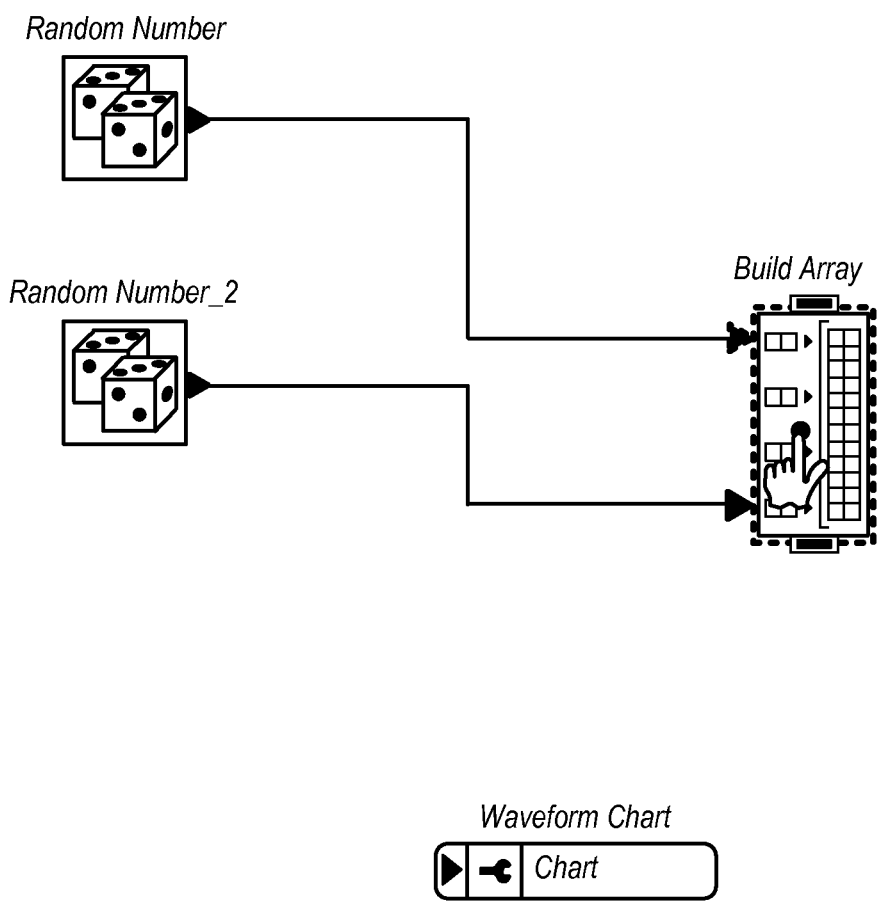
Figure 31:
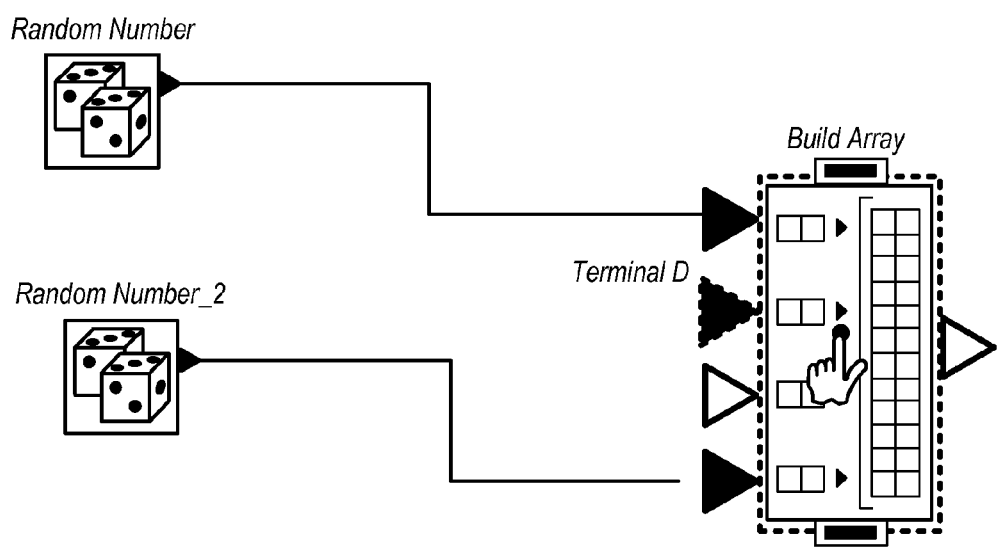
Figure 32:
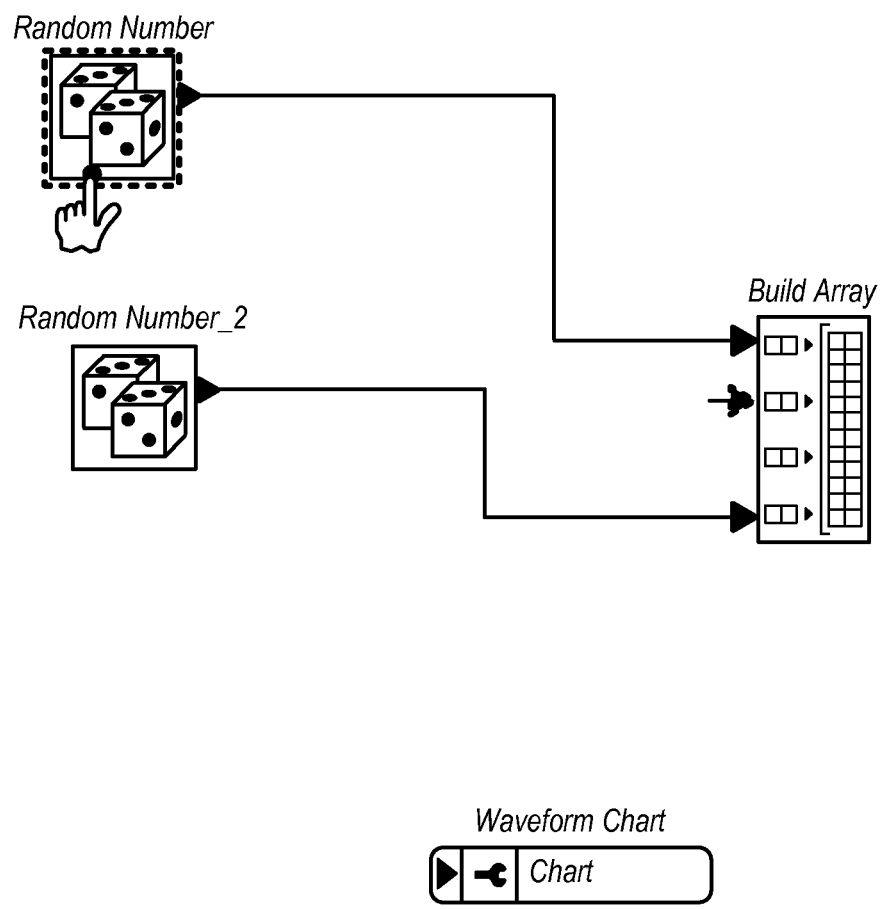

In FIG. 30 the user has selected the Build Array node again by tapping on it once. In FIG. 31, the user has made a second tap to the Build Array node, thus causing the magnified view of the terminals to be displayed again. The Terminal D input terminal has been initially selected by default this time. This is the one the user wants, so the user may then unselect the Build Array node by tapping on a blank location in the graphical program, thus causing the graphical programming application to remove the magnified view and display an arrow head next to the Terminal D input terminal to indicate that a new wiring operation has begun. The user may then tap the Random Number node once to select it, as shown in FIG. 32.

Figure 33:
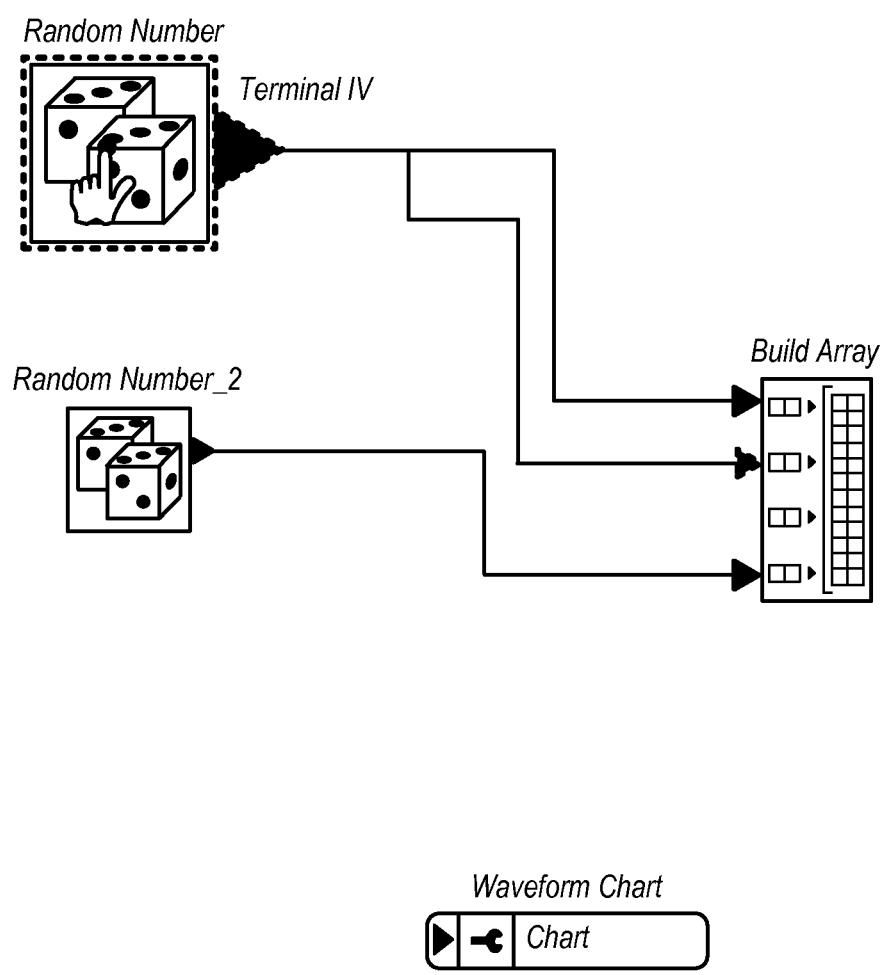
Figure 34:
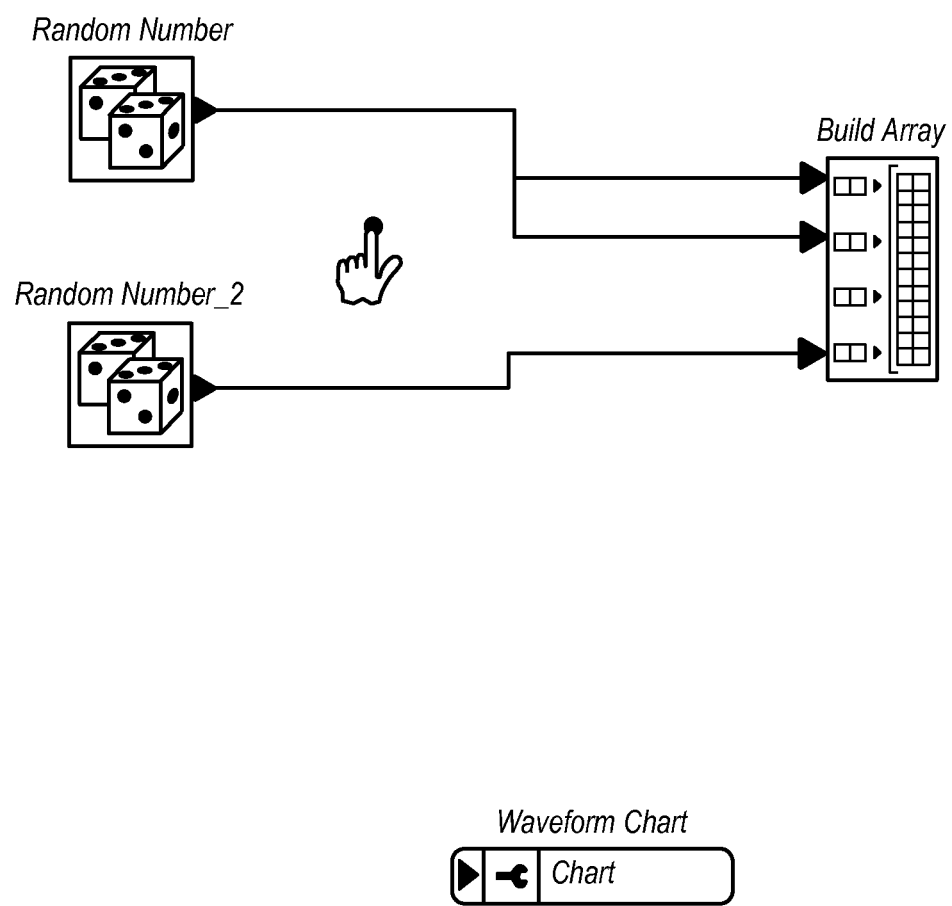

In FIG. 33, the user then taps the Random Number node a second time to cause the graphical programming application to automatically complete the wiring operation. A wire branch has been created to indicate that the output terminal of the Random Number node is connected to two different input terminals of the Build Array node. FIG. 34 shows the user tapping at a blank spot in the graphical program to unselect the Random Number node, thus causing the graphical programming application to remove the magnified view of this node.

FIGS. 35-40 are screen shots illustrating a third embodiment of the wiring method for connecting together nodes in a graphical program. FIG. 35 illustrates the block diagram of a graphical program after the user has dropped several nodes into it. In this embodiment, the magnified view of a node is displayed by tapping a single time on the node, instead of two times. FIG. 36 shows the graphical program after the user has tapped on the Build Array node once. This causes the graphical program to select the Build Array node (as indicated by the thick border around it) and display terminal icons representing its input and output terminals.

Figure 37:
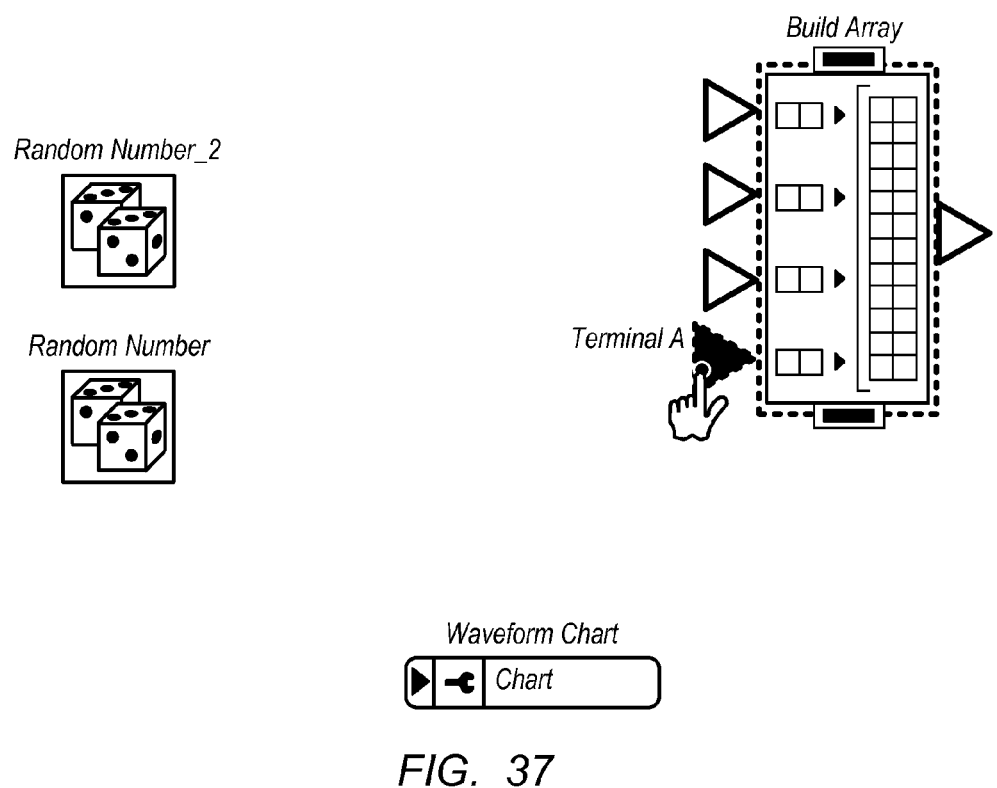
Figure 38:
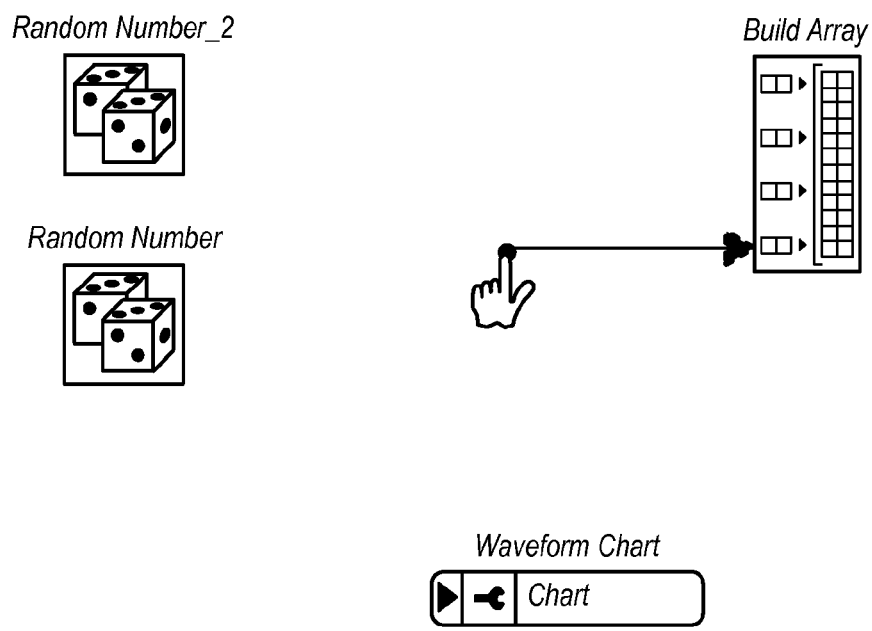
Figure 39:
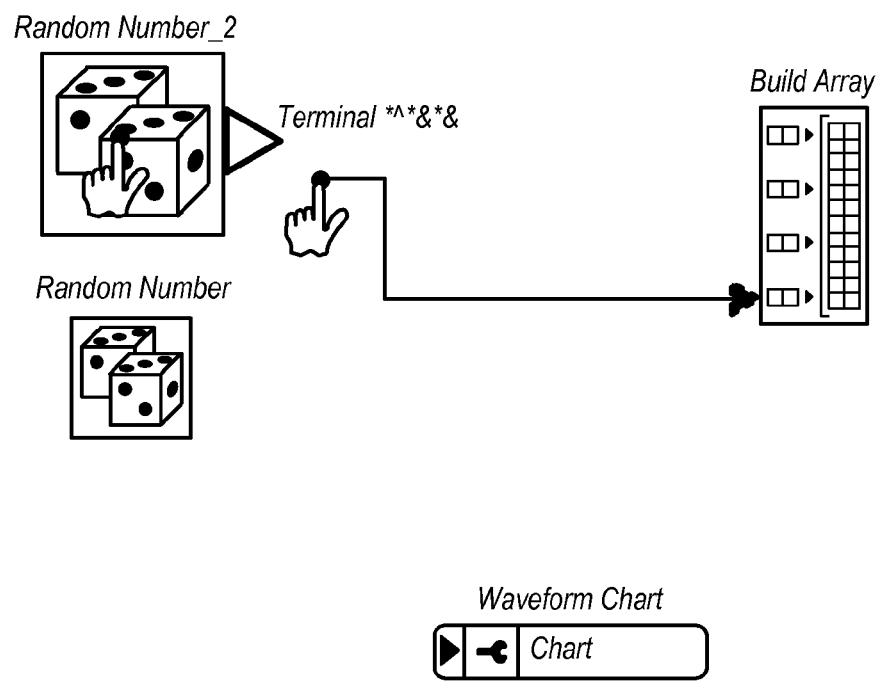

In this example, none of the terminals is initially selected by default. The user can select the desired terminal by tapping directly on it. In FIG. 37, the user has tapped on the bottom-most Terminal A input terminal to select it. The user then drags his finger from this input terminal across the block diagram of the graphical program to begin a wiring operation. As the user drags his finger away from the input terminal, a wire which is anchored to the input terminal at one end follows his finger, thus making it appear that a wire is being drawn out of the input terminal. FIG. 38 shows the graphical program when the user has begun dragging his finger horizontally to the left.

Figure 40:
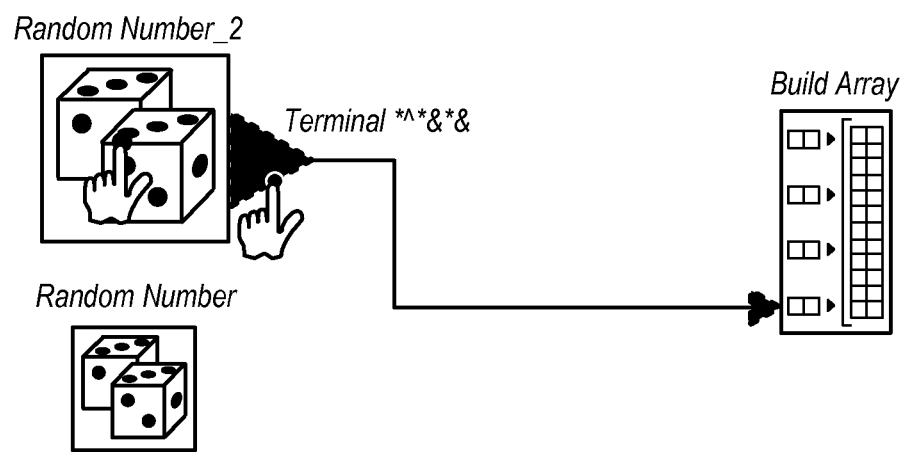

As the user approaches a destination node to which to connect the other end of the wire, the graphical programming application may automatically display a magnified view of the terminals of the destination node. For example, in FIG. 39 the user has dragged his finger near the Random Number_2 node, thus causing the graphical programming application to display a magnified view with a triangular terminal icon representing this node's output terminal. The user may then finish the wiring operation by moving his finger to the desired output terminal icon (there is only one in this example), as shown in FIG. 40.

Figure 42:
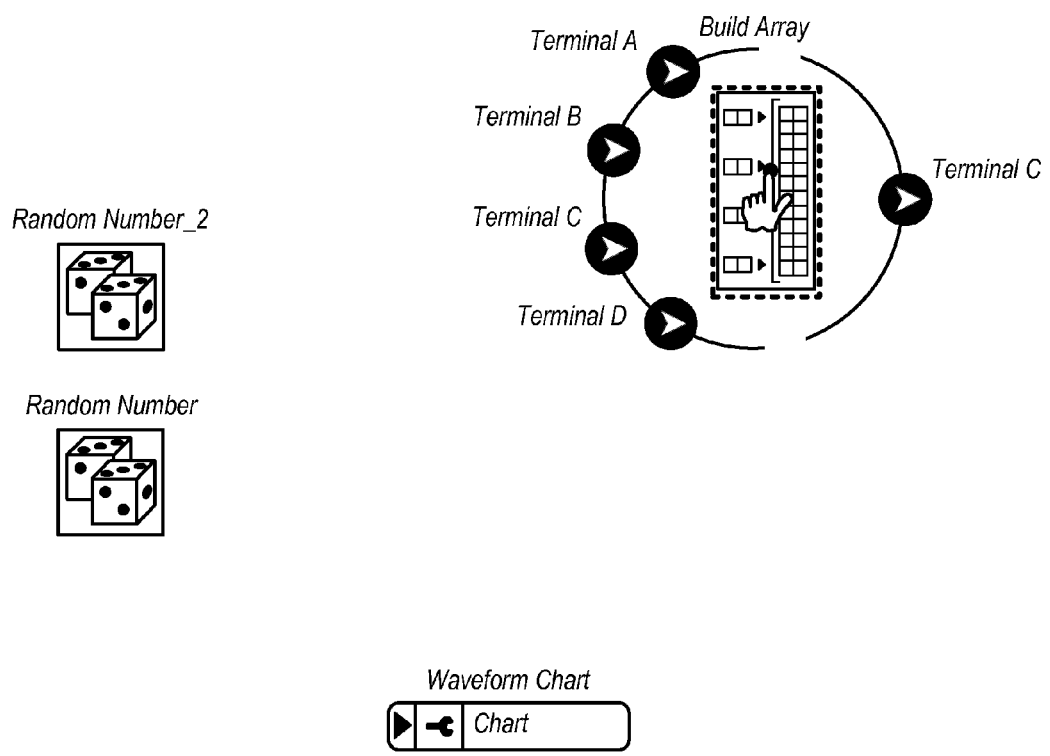

FIGS. 41-53 are screen shots illustrating a fourth embodiment of the wiring method for connecting together nodes in a graphical program. FIG. 41 illustrates the block diagram of a graphical program after the user has dropped several nodes into it. The user has tapped on the Build Array node once to select it, as indicated by the thick border displayed around it. FIG. 42 shows the graphical program after the user has tapped on the Build Array node a second time. This causes a magnified view of the input and output terminals of the node to be displayed. In this embodiment, a curved arc is displayed on the left of the node, and the input terminals are arranged in a curve along this arc. Similarly, another curved arc is displayed on the right, and the output terminals (there is only one in this example) are arranged in a curve along this arc. Each terminal is displayed by displaying a respective terminal icon along with the name of the terminal. In this example, each terminal icon is displayed as a triangle within a circle, but in other embodiments the terminal icons may have any other desired visual appearance.

Figure 43:
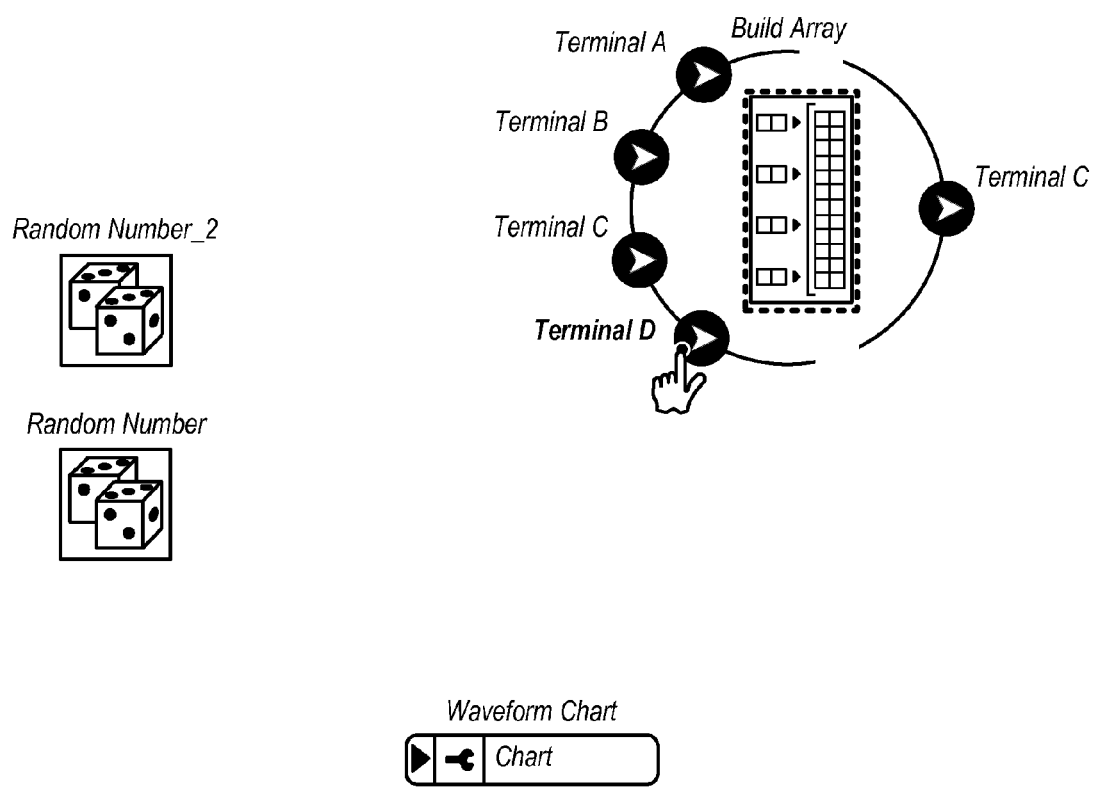
Figure 44:
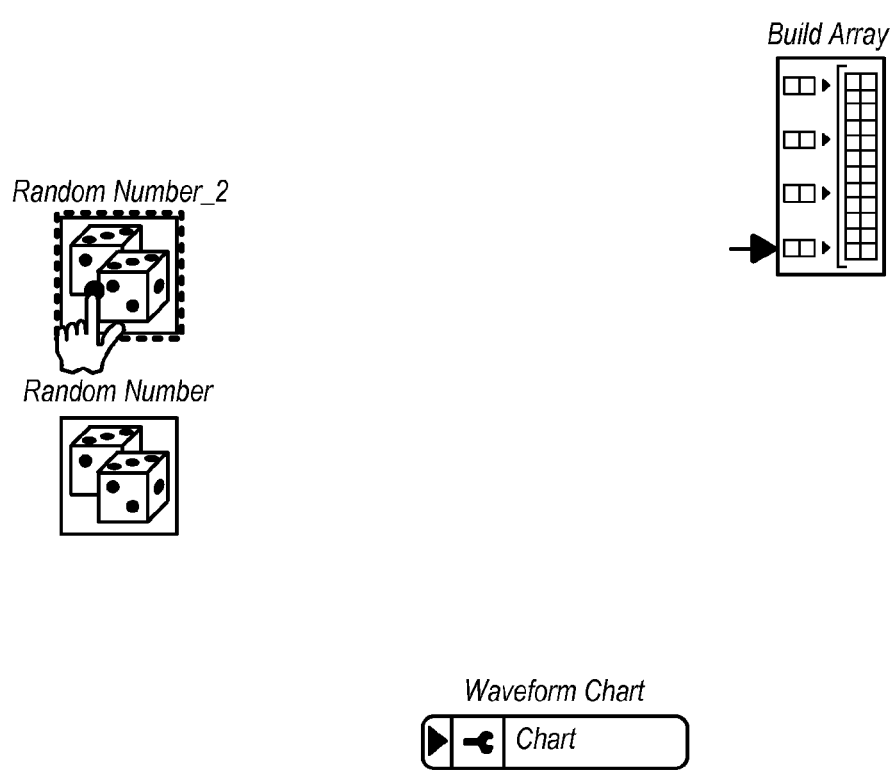

In FIG. 43 the user has tapped on the Terminal D input terminal to select it. The user may then tap on the Random Number_2 node to close the magnified view of the Build Array node and select the Random Number_2 node, as shown in FIG. 44. The graphical programming application has displayed a wire arrow head next to the Terminal D input terminal which the user selected to indicate that a wiring operation to this terminal has been initiated.

Figure 45:
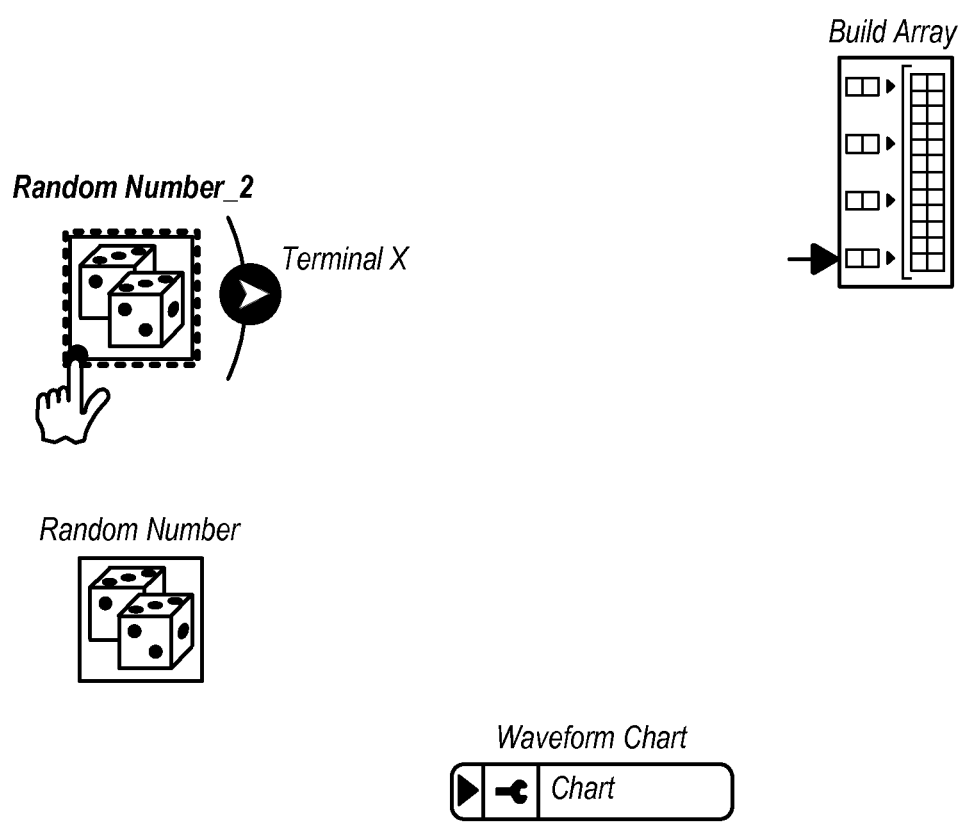

In FIG. 45 the user has made a second finger tap on the Random Number_2 node to cause a magnified view of its input/output terminals to be displayed. Again, the terminal(s) are displayed along a curved arc. In this example, the node only has a single output terminal and does not have any input terminals.

Figure 46:
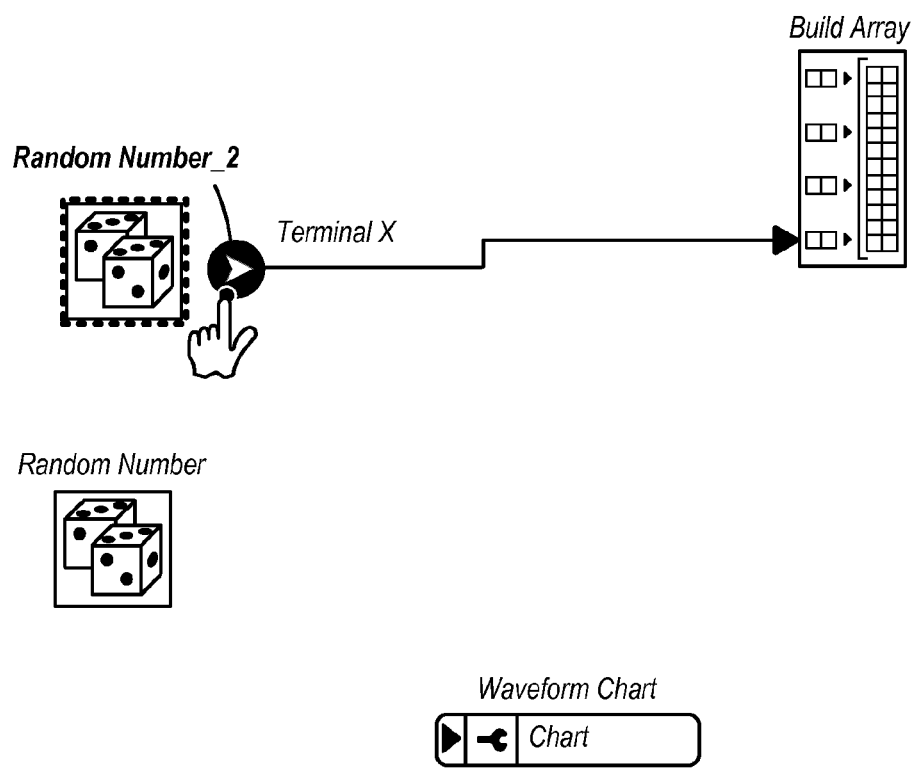

The user may then tap on the desired output terminal (of which only one is available in this example) of the Random Number_2 node to complete the wiring operation. As shown in FIG. 46, the graphical programming application has displayed a data flow wire between the selected input terminal and the selected output terminal.

Figure 47:
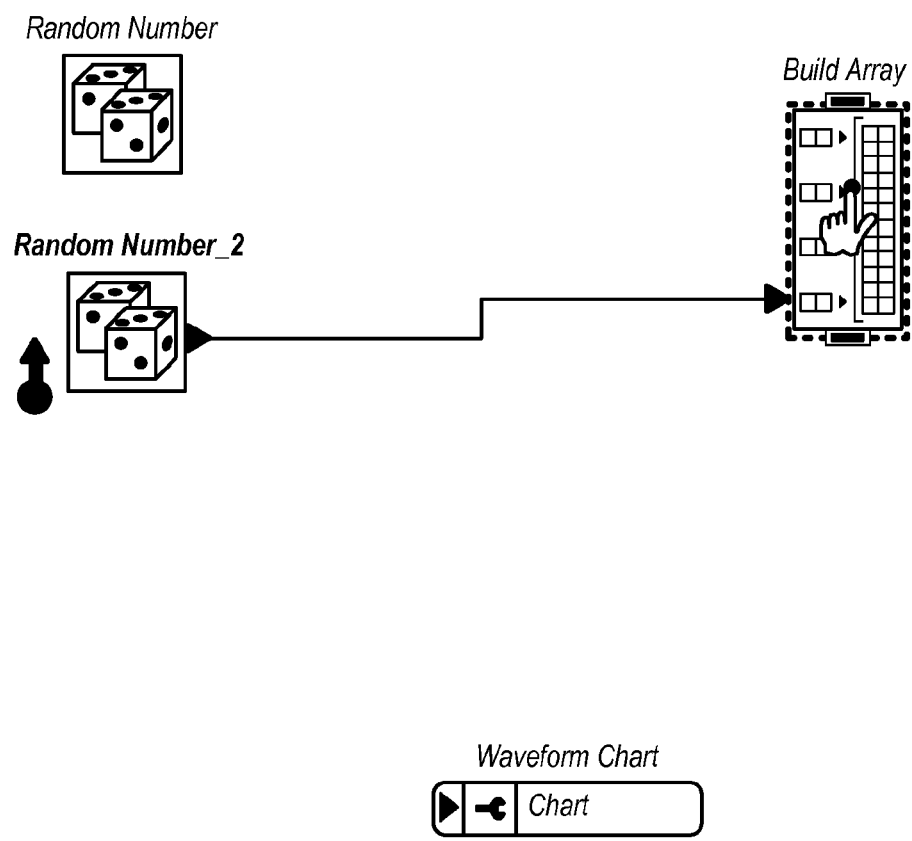
Figure 48:
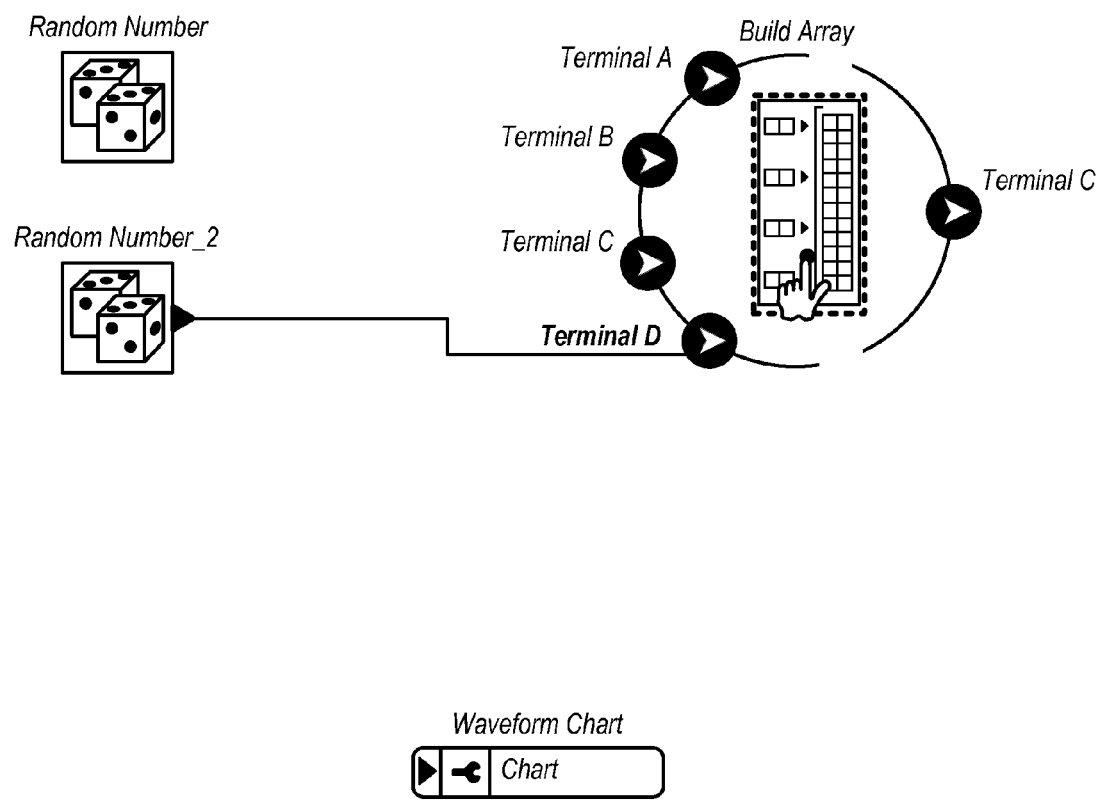
Figure 49:
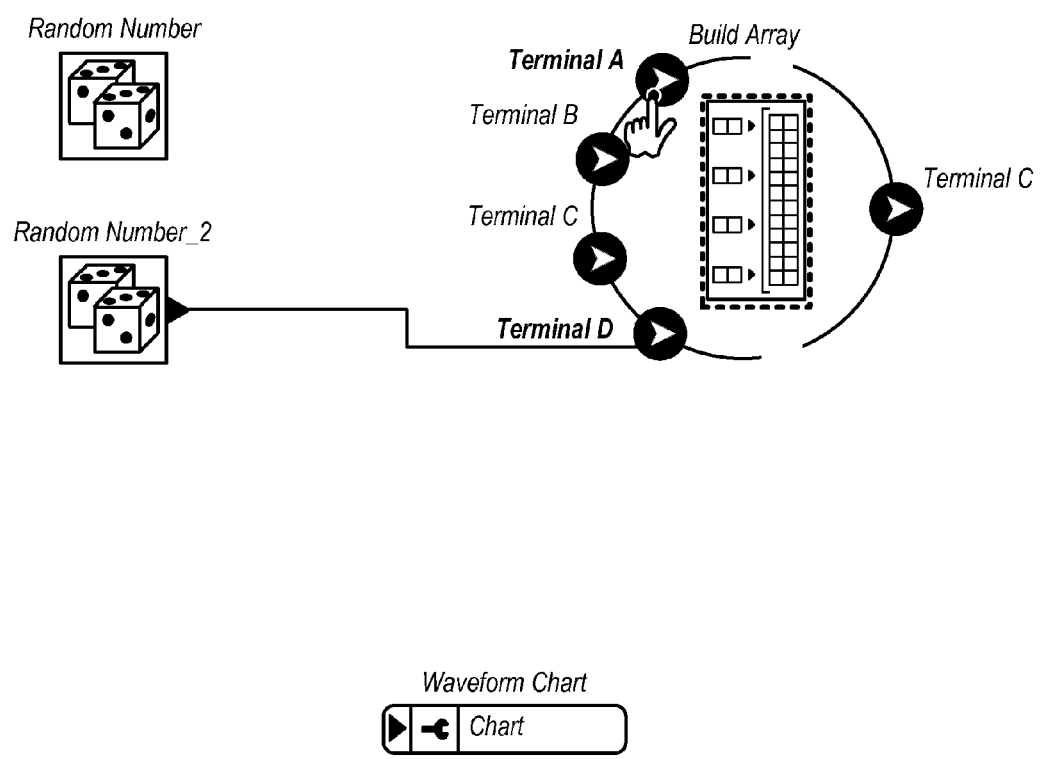

FIG. 47 illustrates the graphical program after the user has dragged the Random_Number node to a new position above the Random_Number_2 node, and has then tapped once on the Build Array node to select it. FIG. 48 illustrates the graphical program after the user has then tapped on the Build Array node a second time to cause a magnified view of its input and output terminals to be displayed. FIG. 49 shows the user tapping on the Terminal A input terminal to select it.

Figure 50:
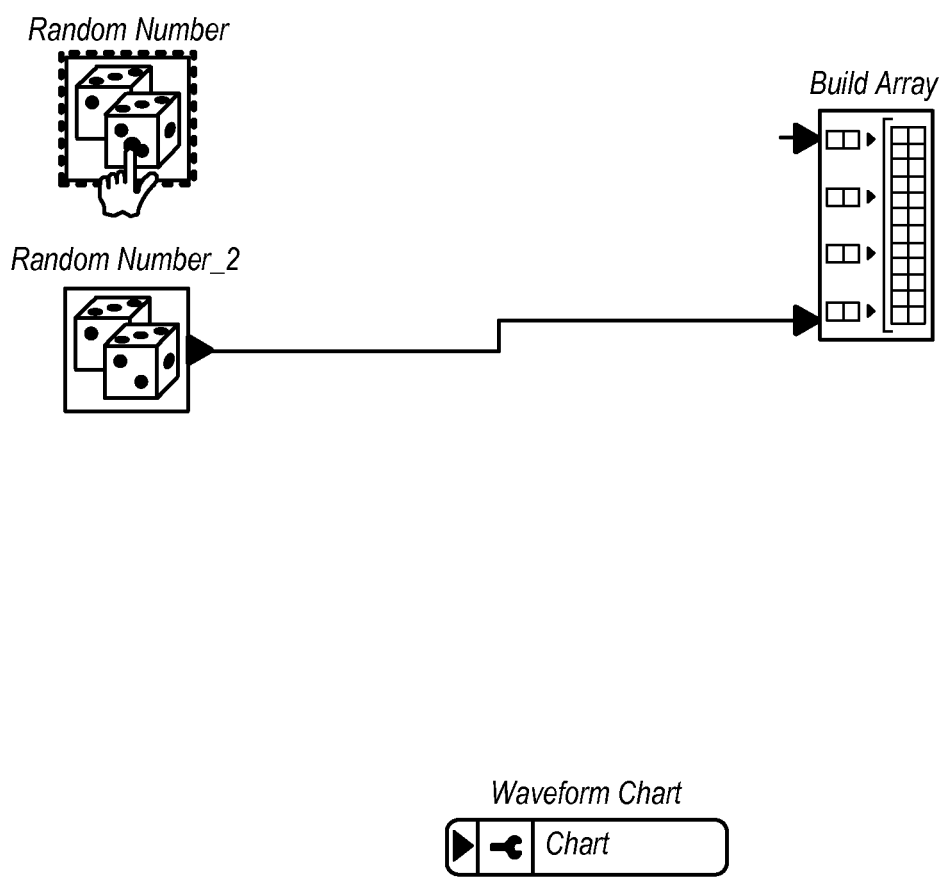

The user may then tap on the Random Number node to close the magnified view of the Build Array node and select the Random Number node, as shown in FIG. 50. The graphical programming application has displayed a wire arrow head next to the Terminal A input terminal which the user selected to indicate that a wiring operation to this terminal has been initiated.

Figure 51:
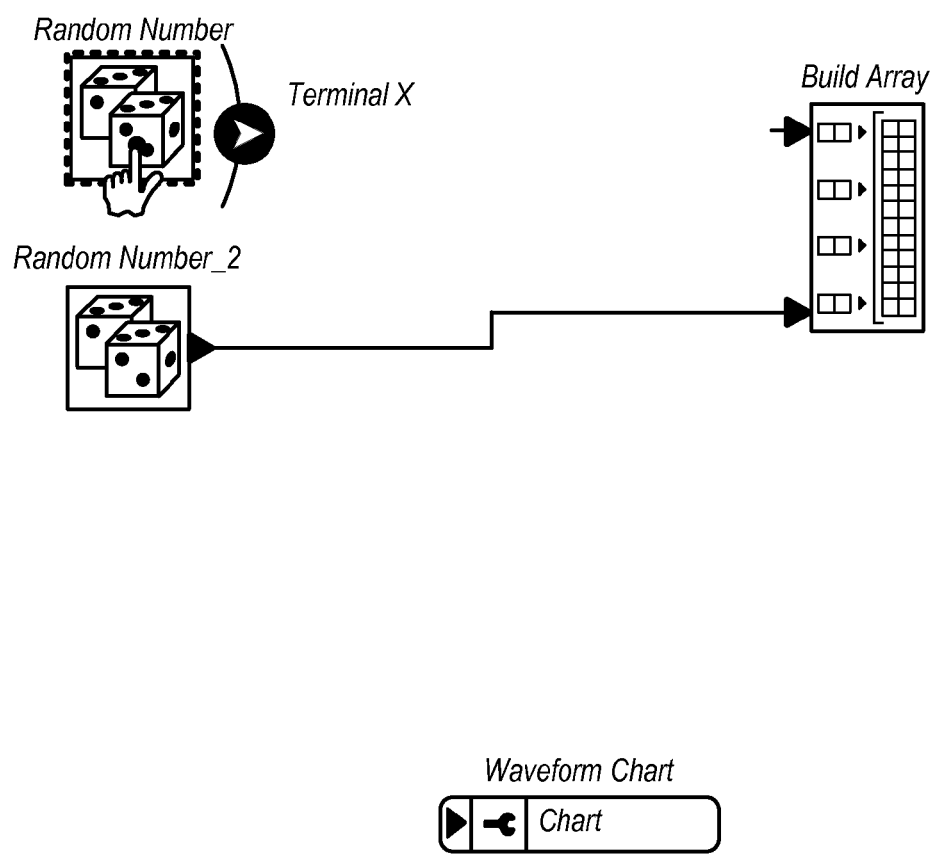
Figure 52:
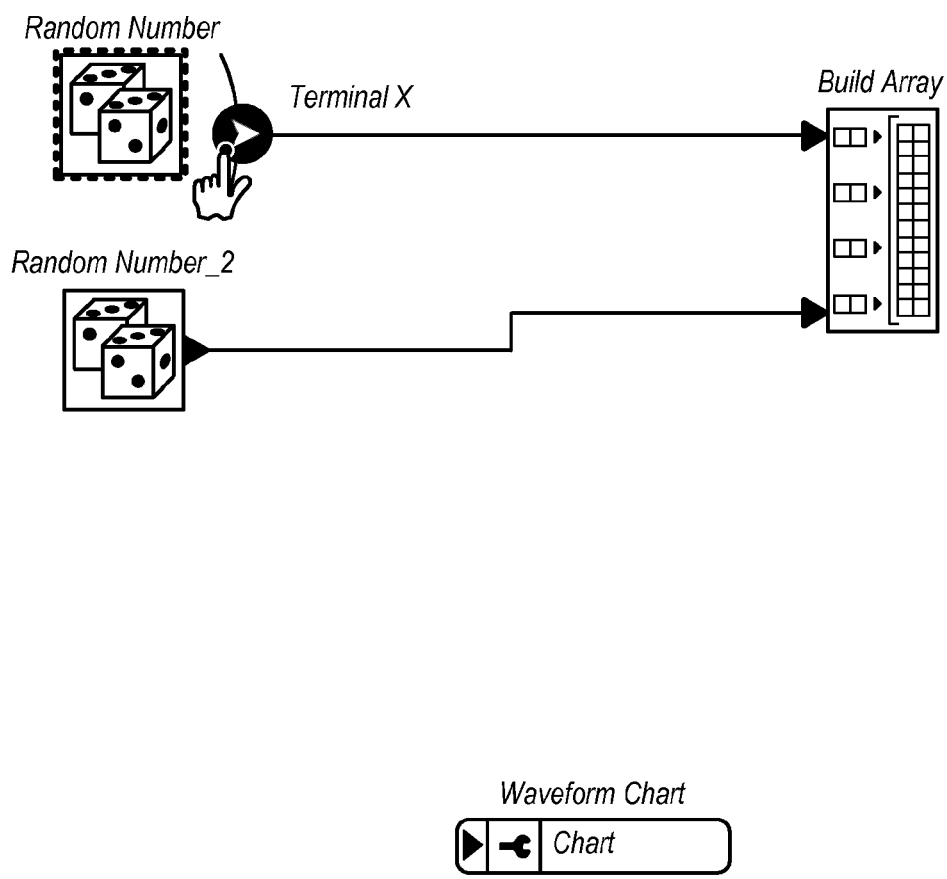

In FIG. 51 the user has made a second finger tap on the Random Number node to cause a magnified view of its output terminal to be displayed. The user may then tap on the output terminal to complete the wiring operation. As shown in FIG. 52, the graphical programming application has displayed a data flow wire between the selected input terminal and the selected output terminal.

In some embodiments, if a node has many input terminals (or output terminals) then only a subset of them may be visible within the magnified view at once. The user may be able to scroll through the terminals to see the others, as shown in FIG. 53. As shown in this figure, the user may tap twice to cause the magnified view of the terminals to be displayed along an arc. The user can place his finger along the arc and drag it either upward or downward to cause the terminals to scroll in the desired direction. Once the terminal that the user wants is visible, he may select it in order to connect a data flow wire to it.

FIGS. 54-60 are screen shots illustrating a fifth embodiment of the wiring method for connecting together nodes in a graphical program. FIG. 54 illustrates the block diagram of a graphical program after the user has dropped several nodes into it. The user has tapped once on the Build Array node to select it, as indicated by the thick border drawn around it. In this embodiment, selecting a node causes the graphical programming application to display a wiring icon 810 proximal to the selected node. The user can tap on the wiring icon 810 to cause the graphical programming application to display a magnified view of the node's terminals so that the user can perform a wiring operation. In this example, the wiring icon looks like a spool of wire to indicate that the user can click on it to perform a wiring operation, but in other embodiments the wiring icon can have other appearances, as desired. Also, in some embodiments the wiring icon may not be displayed proximally to the selected node, but may instead be displayed elsewhere in the graphical user interface of the graphical programming application.

Figure 56:
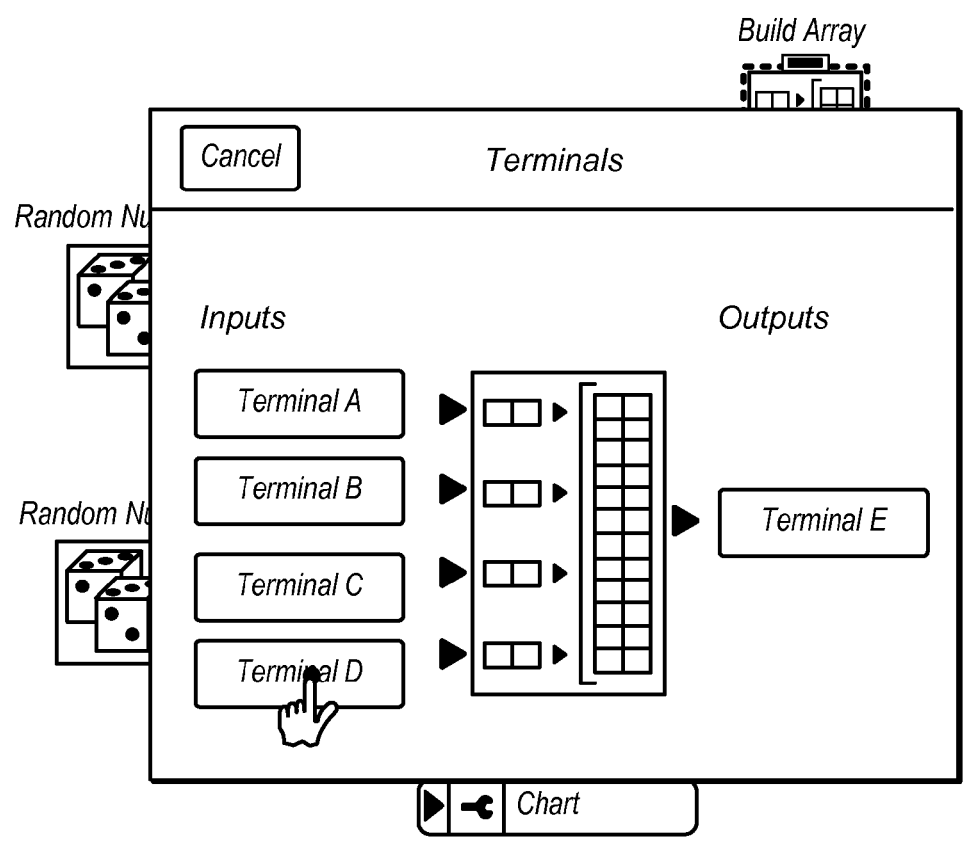

FIG. 55 shows the user tapping on the wiring icon. This causes the graphical programming application to display a magnified view of the node's terminals. In some embodiments, the magnified view of the terminals is displayed within a separate popup window which is overlayed on the original block diagram window, as shown in FIG. 56. The overlay window displays the icon of the selected node, with buttons and/or icons corresponding to the node's terminals arranged alongside the icon. The user can select the desired button or icon to begin a wiring operation. FIG. 56 shows the user tapping on the button for the Terminal D terminal to select it. Selecting the terminal may cause the graphical programming application to close the overlay window and display a wire arrow ahead next to the terminal that was selected.

Figure 57:
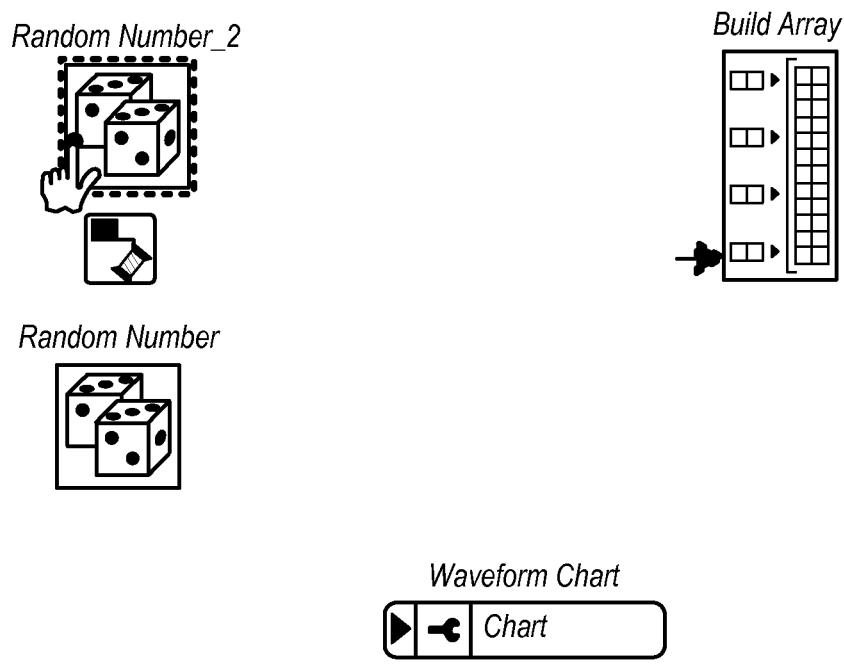
Figure 58:
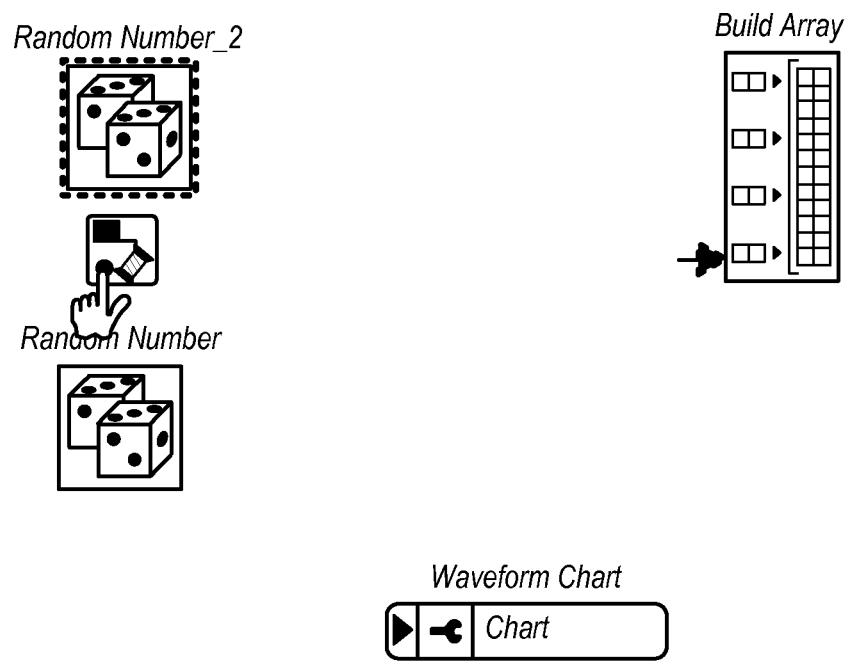
Figure 59:
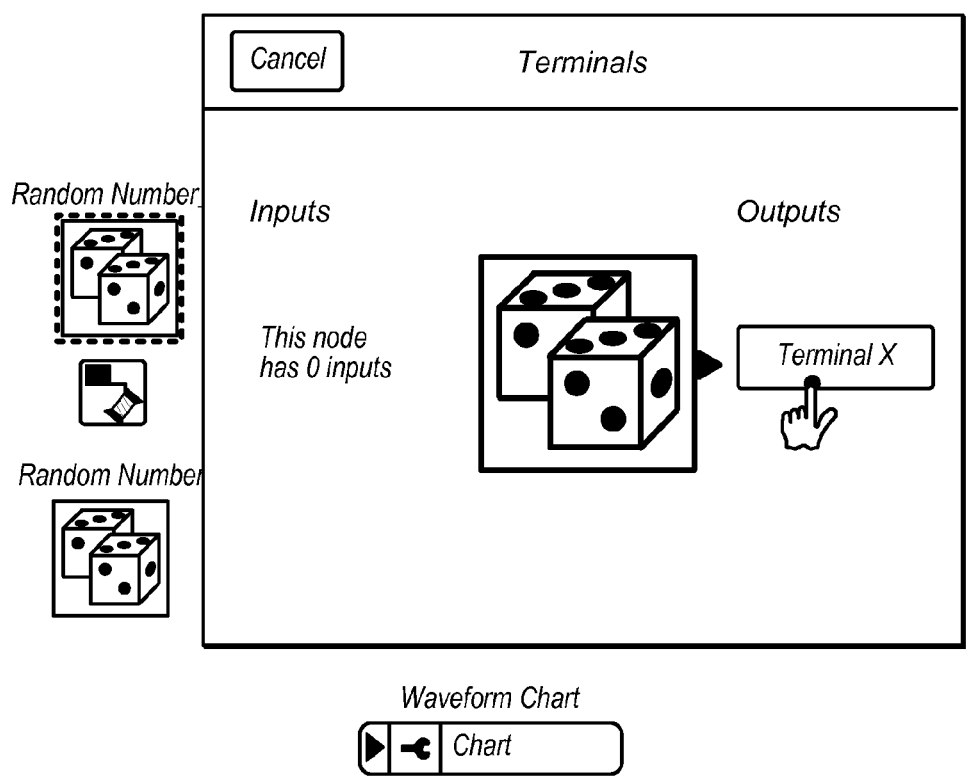

FIG. 57 shows the user tapping on the Random Number_2 node to select it. This causes the graphical programming application to display a thick border around this node and also display a wiring icon proximal to the node. FIG. 58 shows the user tapping on the wiring icon. In response, the graphical programming application may display an overlay window with a magnified view of the Random Number_2 node's output terminal, as shown in FIG. 59. In this example, the overlay window informs the user that the node has no input terminals. The user may then select the output terminal by tapping on it, which may cause the graphical programming application to close the overlay window and display a data flow wire between the output terminal of the Random Number_2 node and the selected input terminal of the Build Array node, as shown in FIG. 60.

As described above, in some embodiments when the magnified view of a node's input terminals or output terminals is displayed, one of the terminals may be initially selected by default. If there is more than one terminal, the user can change the selection to a different terminal to use in the wiring operation. In some embodiments the graphical programming application may determine which terminal should be the default selected terminal via an algorithm or heuristic. The algorithm or heuristic may attempt to select the default terminal based on the current state of the graphical program or graphical programming application, e.g., to try to intelligently select by default the terminal the user is most likely to want to use in the wiring operation. For example, when tapping on a node to begin a new wiring operation, the graphical programming application may select one of the node's output terminals by default, e.g., since many users may generally perform wiring operations by first selecting an output terminal of a source node and then connecting it to an input terminal of a destination node. When tapping on a node to complete a wiring operation that was begun at another node, the graphical programming application may select one of the node's input terminals by default if the other end of the wire was connected to an output terminal, or may select one of the node's output terminals by default if the other end of the wire was connected to an input terminal.

If the user first selects a terminal of a first node and then taps on a second node to complete the wiring operation, the graphical programming system may cause the default selected terminal of the second node to be a terminal that matches characteristics of the other terminal selected in the first node. For example, the terminal selected in the first node may be associated with a particular data type, so the graphical programming system may cause the default selected terminal of the second node to be a terminal associated with the same data type. In other embodiments the system may attempt to match the terminals based on any of various other characteristics besides data type.

Figure 60:
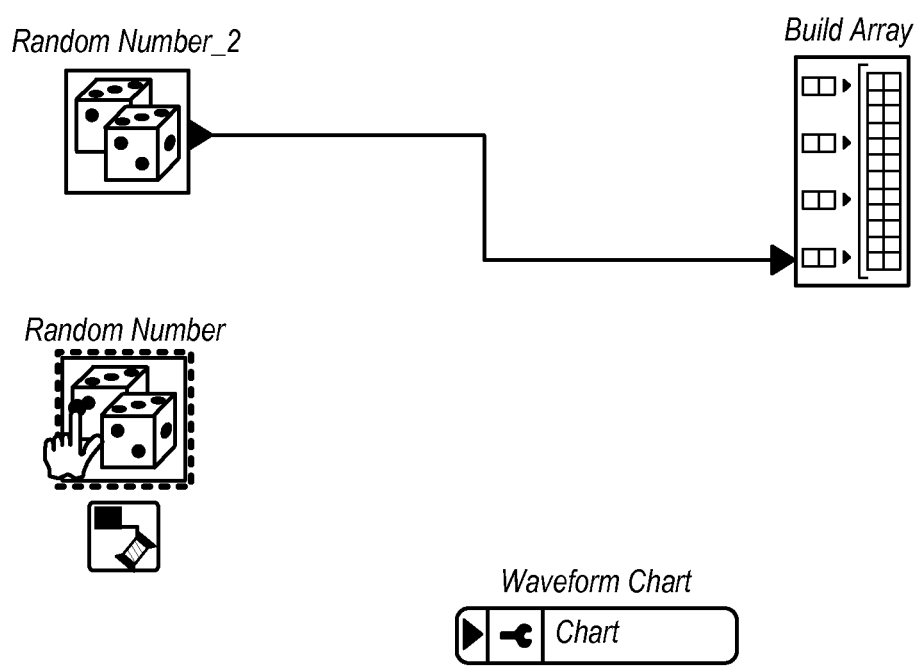

The FIGS. 9-60 described above are provided as examples to show particular embodiments of the wiring method for wiring together the nodes in a graphical program to indicate data flow among the nodes. Numerous other embodiments are contemplated. In particular, although the user input is described above in terms of particular touch gestures such as finger taps, finger drags, etc., in other embodiments the method may operate based on any of various other kinds of touch gestures that use one or more fingers or pointing devices applied to a touch-sensitive display device. Also, the input/output terminals of the nodes may be displayed in a magnified view in any desired way and with any desired visual appearance in various embodiments.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method comprising:
displaying a plurality of nodes in a graphical program on a touch-based display device; and
connecting a particular input terminal of a first node of the plurality of nodes to a particular output terminal of a second node of the plurality of nodes in response to touch gesture input received to the graphical program, wherein said connecting includes:
displaying a magnified view of one or more input terminals of the first node in response to touch gesture input, wherein said displaying the magnified view of the one or more input terminals of the first node in response to touch gesture input comprises displaying a respective terminal icon corresponding to each respective input terminal of the one or more input terminals, and wherein said displaying a respective terminal icon corresponding to each respective input terminal of the one or more input terminals comprises arranging the terminal icons along a curved arc;
selecting the particular input terminal from the magnified view of the one or more input terminals in response to touch gesture input, wherein said selecting comprises selecting the respective terminal icon corresponding to the particular input terminal; and
displaying a data flow wire connecting the particular input terminal of the first node to the particular output terminal of the second node.

2. The method of claim 1, wherein said connecting further includes:
displaying a magnified view of one or more output terminals of the second node in response to touch gesture input; and
selecting the particular output terminal from the magnified view of the one or more output terminals in response to touch gesture input.

3. The method of claim 1,
wherein the touch gesture input selecting the respective terminal icon corresponding to the particular input terminal comprises a finger tap.

4. The method of claim 1, wherein said connecting further includes:
receiving touch gesture input dragging from the first node to the second node.

5. The method of claim 1,
wherein the first node has a plurality of input terminals, wherein said displaying the magnified view of the one or more input terminals of the first node comprises displaying a subset of the plurality of input terminals without displaying all of the plurality of input terminals.

6. The method of claim 5, further comprising:
scrolling through all of the plurality of input terminals of the first node in response to touch gesture input.

7. The method of claim 1,
wherein said displaying the magnified view of the one or more input terminals of the first node in response to touch gesture input comprises displaying a magnifying glass in which the first node is magnified.

8. The method of claim 7,
wherein displaying the magnifying glass comprises displaying the magnifying glass in response to detecting a finger tap held for at least a threshold amount of time.

9. The method of claim 7,
wherein displaying the magnifying glass comprises displaying the magnifying glass at a first location in the graphical program and then moving the magnifying glass over the first node in response to touch gesture input.

10. The method of claim 1,
wherein said displaying the magnified view of the one or more input terminals of the first node in response to touch gesture input comprises displaying a zoomed-in view of the entire graphical program in response to touch gesture input.

11. The method of claim 1, further comprising:
displaying a wiring icon corresponding to the first node;
wherein the magnified view of the one or more input terminals of the first node is displayed in response to touch gesture input to the wiring icon.

12. The method of claim 11, wherein the wiring icon is displayed proximal to the first node.

13. The method of claim 1, wherein said displaying the magnified view of the one or more input terminals of the first node comprises displaying the magnified view in a separate window overlayed over the graphical program.

14. The method of claim 1,
wherein said displaying the magnified view of the one or more input terminals of the first node in response to touch gesture input comprises displaying a respective terminal name corresponding to each respective input terminal of the one or more input terminals.

15. The method of claim 1, wherein said displaying the magnified view of the one or more input terminals of the first node comprises:
receiving a first finger tap to the first node to select the first node; and
receiving an additional finger tap to the first node while the first node is selected, wherein the additional finger tap causes the magnified view of the one or more input terminals of the first node to be displayed.

16. A non-transitory memory medium storing program instructions executable by one or more processors of a mobile device to cause the mobile device to:
display a plurality of nodes in a graphical program on a touch-based display device of the mobile device; and
connect a particular input terminal of a first node of the plurality of nodes to a particular output terminal of a second node of the plurality of nodes in response to touch gesture input received to the graphical program, wherein said connecting includes:

displaying a magnified view of one or more input terminals of the first node in response to touch gesture input, wherein said displaying the magnified view of the one or more input terminals of the first node in response to touch gesture input comprises displaying a respective terminal icon corresponding to each respective input terminal of the one or more input terminals, and wherein said displaying a respective terminal icon corresponding to each respective input terminal of the one or more input terminals comprises arranging the terminal icons along a curved arc;

selecting the particular input terminal from the magnified view of the one or more input terminals in response to touch gesture input, wherein said selecting comprises selecting the respective terminal icon corresponding to the particular input terminal; and displaying a data flow wire connecting the particular input terminal of the first node to the particular output terminal of the second node.

17. The non-transitory memory medium of claim 16, wherein said connecting further includes:
displaying a magnified view of one or more output terminals of the second node in response to touch gesture input; and
selecting the particular output terminal from the magnified view of the one or more output terminals in response to touch gesture input.

18. A mobile device comprising:
one or more processors;
memory storing program instructions; and
a touch-based display device;
wherein the program instructions are executable by the one or more processors to cause the mobile device to:
display a plurality of nodes in a graphical program on a touch-based display device of the mobile device; and
connect a particular input terminal of a first node of the plurality of nodes to a particular output terminal of a second node of the plurality of nodes in response to touch gesture input received to the graphical program, wherein said connecting includes:
displaying a magnified view of one or more input terminals of the first node in response to touch gesture input, wherein said displaying the magnified view of the one or more input terminals of the first node in response to touch gesture input comprises displaying a respective terminal icon corresponding to each respective input terminal of the one or more input terminals, and wherein said displaying a respective terminal icon corresponding to each respective input terminal of the one or more input terminals comprises arranging the terminal icons along a curved arc;
selecting the particular input terminal from the magnified view of the one or more input terminals in response to touch gesture input, wherein said selecting comprises selecting the respective terminal icon corresponding to the particular input terminal; and
displaying a data flow wire connecting the particular input terminal of the first node to the particular output terminal of the second node.

19. The mobile device of claim 18, wherein said connecting further includes:
displaying a magnified view of one or more output terminals of the second node in response to touch gesture input; and
selecting the particular output terminal from the magnified view of the one or more output terminals in response to touch gesture input.

\* \* \* \* \*